(12) United States Patent
Wang et al.

(10) Patent No.: US 11,513,623 B2
(45) Date of Patent: Nov. 29, 2022

(54) ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiao Wang, Beijing (CN); Yan Yan, Beijing (CN); Yu Ma, Beijing (CN)

(73) Assignees: BEIJING BOE DISPLAY TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 121 days.

(21) Appl. No.: 16/980,799

(22) PCT Filed: Nov. 4, 2019

(86) PCT No.: PCT/CN2019/115287
§ 371 (c)(1),
(2) Date: Sep. 14, 2020

(87) PCT Pub. No.: WO2021/087650
PCT Pub. Date: May 14, 2021

(65) Prior Publication Data
US 2021/0247867 A1 Aug. 12, 2021

(51) Int. Cl.
*G02F 1/1343* (2006.01)
*G06F 3/041* (2006.01)
(Continued)

(52) U.S. Cl.
CPC ........ *G06F 3/0412* (2013.01); *G02F 1/13338* (2013.01); *G02F 1/133512* (2013.01);
(Continued)

(58) Field of Classification Search
CPC ............... G06F 3/0412; G02F 1/13338; G02F 1/133512; G02F 1/134345;
(Continued)

(56) References Cited

U.S. PATENT DOCUMENTS

2017/0177159 A1* 6/2017 Cao ................. G06F 3/0412
2019/0129549 A1  5/2019 Yeh et al.
2019/0319052 A1  10/2019 Koshida

FOREIGN PATENT DOCUMENTS

CN    107121820 A    9/2017
CN    109582179 A    4/2019
CN    209373316 U    9/2019

* cited by examiner

*Primary Examiner* — James A Dudek
(74) *Attorney, Agent, or Firm* — McCoy Russell LLP

(57) ABSTRACT

An array substrate includes a substrate, a gate line on the substrate, a sub-pixel, two data lines, a touch signal line, a functional electrode, and a touch electrode unit. The orthographic projection of the touch signal line on the substrate partially overlaps orthographic projection of an opening area of the sub-pixel on the substrate; the touch electrode unit is coupled to the touch signal line; the extension directions of the first and second sub-function electrode portions of the functional electrode are the same as that of the data line, the first/second sub-functional electrode portion is located on a first/second side of the sub-pixel opening area; along the extending direction of the gate line, a distance between the first/second sub-functional electrode portion and the touch signal line is smaller than a distance between the data line on the first/second side and the touch signal line.

20 Claims, 10 Drawing Sheets

(51) Int. Cl.
  *G02F 1/1333* (2006.01)
  *G02F 1/1335* (2006.01)
  *G02F 1/1362* (2006.01)
  *H01L 27/12* (2006.01)
  *G02F 1/1368* (2006.01)

(52) U.S. Cl.
  CPC .. *G02F 1/134345* (2021.01); *G02F 1/134363* (2013.01); *G02F 1/136286* (2013.01); *H01L 27/124* (2013.01); *H01L 27/1259* (2013.01); *G02F 1/1368* (2013.01); *G02F 2201/40* (2013.01)

(58) Field of Classification Search
  CPC ......... G02F 1/134363; G02F 1/136286; G02F 1/1368; G02F 2201/40; G02F 1/134309; H01L 27/124
  See application file for complete search history.

ARRAY SUBSTRATE AND DISPLAY DEVICE

CROSS-REFERENCE TO RELATED APPLICATION

The present application is a U.S. National Phase of International Patent Application Serial No. PCT/CN2019/115287 entitled "ARRAY SUBSTRATE AND DISPLAY DEVICE," filed on Nov. 4, 2019. The entire contents of each of the above-referenced applications are hereby incorporated by reference for all purposes.

TECHNICAL FIELD

The present disclosure relates to the field of display technology, in particular to an array substrate and a display device.

BACKGROUND AND SUMMARY

With the development of display technology, liquid crystal display panels have been successfully applied to display devices such as notebook computers and televisions. The liquid crystal display panel mainly includes an array substrate and an opposite substrate which are arranged oppositely, and a liquid crystal layer disposed between the array substrate and the opposite substrate. When the liquid crystal display panel is in operation, a driving electric field is generated between the array substrate and the opposite substrate, the liquid crystal molecules in the liquid crystal layer are deflected under the driving of the driving electric field, thereby realizing the display function of the liquid crystal display panel.

The present disclosure provides an array substrate and a display device.

In a first aspect, An array substrate includes: a substrate; two data lines adjacent to each other arranged on the substrate; a gate line, arranged on the substrate and crossing the two data lines; a sub-pixel arranged in an area enclosed by the gate line and the two data lines; a touch signal line, arranged on the substrate and extending in a same direction as an extension direction of the two data lines, wherein orthographic projection of the touch signal line on the substrate partially overlaps orthographic projection of an opening area of the sub-pixel on the substrate; the functional electrode arranged on the substrate, wherein the functional electrode includes a first sub-functional electrode portion and a second sub-functional electrode portion, an extension direction of the first sub-functional electrode portion, and an extension direction of the second sub-functional electrode portion is the same as the extension direction of the two data lines, the first sub-functional electrode portion is located on a first side of the opening area of the sub-pixel, and the second sub-functional electrode portion is located on a second side of the opening area of the sub-pixel, and the first side and the second side are opposite to each other along a direction perpendicular to the extension direction the two data lines; along an extension direction of the gate line and on a same straight line, a distance between orthographic projection of the first sub-function electrode portion on the substrate and orthographic projection of the touch signal line on the substrate is smaller than a distance between orthographic projection of the data line on the first side on the substrate and orthographic projection of the touch signal line on the substrate; along the extension direction of the gate line and on a same straight line, a distance between the orthographic projection of the second sub-function electrode portions on the substrate and the orthographic projection of the touch signal line on the substrate is smaller than a distance between orthographic projection of the data line on the second side on the substrate and the orthographic projection of the touch signal line on the substrate; and a touch electrode unit arranged on the substrate and coupled to the touch signal line.

In some embodiments, along the extension direction of the gate line and on a same straight line, the distance between the orthographic projection of the first sub-function electrode portion on the substrate and the orthographic projection of the touch signal line on the substrate is greater than the distance between the orthographic projection of the second sub-function electrode portion on the substrate and the orthographic projection of the touch signal line on the substrate.

In some embodiments, the array substrate comprises: a plurality of gate lines, a plurality of data lines, and a plurality of sub-pixels; the plurality of gate lines and the plurality of data lines enclose a plurality of sub-pixel areas, and the plurality of sub-pixels are located in the plurality of sub-pixel areas in a one-to-one correspondence; the plurality of sub-pixels include a plurality of sub-pixel columns, and the sub-pixel column includes a plurality of the sub-pixels arranged along an extension direction of the data line; the array substrate further includes: a touch electrode layer arranged in a touch area of the array substrate, the touch area includes a plurality of touch sub-areas, the touch electrode layer includes a plurality of the touch electrode units, the plurality of touch electrode units are located in the plurality of touch sub-areas in a one-to-one correspondence; and, a plurality of touch signal lines coupled to the plurality of touch electrode units in a one-to-one correspondence, and the plurality of touch signal lines correspond to target sub-pixel columns of the plurality of sub-pixel columns in a one-to-one correspondence, the orthographic projection of the touch signal line on the substrate partially overlaps orthographic projection of an opening area of each sub-pixel in the corresponding target sub-pixel column on the substrate; the array substrate further includes: a plurality of the functional electrodes corresponding to the plurality of sub-pixels in a one-to-one correspondence, orthographic projection of the touch signal line on the substrate, and orthographic projection of the second sub-function electrode portion corresponding to each target sub-pixel in a corresponding target sub-pixel column on the substrate have a first overlapping area, and the touch signal line is coupled to the second sub-function electrode portion corresponding to at least a part of the target sub-pixels through a first via hole in at least a part of first overlapping area; target sub-pixels included in the target sub-pixel column corresponding to the touch signal line is located in a touch sub-area corresponding to the touch signal line.

In some embodiments, the functional electrode further comprises a third sub-functional electrode portion, an extension direction of the third sub-functional electrode portion is the same as the extension direction of the gate line, and the third sub-function electrode portion is electrically connected to the first sub-function electrode portion.

In some embodiments, each sub-pixel further comprises a common electrode; the common electrode is located between a corresponding functional electrode and the substrate, and is in direct contact with the first sub-function electrode portion and the third sub-function electrode portion of the corresponding functional electrode.

In some embodiments, the orthographic projection of the touch signal line on the substrate and the orthographic projection of the second sub-function electrode portion corresponding to each sub-pixel in the target sub-pixel column on the substrate have a first overlapping area, and the touch signal line is coupled to the second sub-function electrode portion corresponding to each sub-pixel in the sub-pixel column through the first via hole in the first overlapping area.

In some embodiments, the array substrate further includes: a first conductive connection portion and a second conductive connection portion; in the functional electrode corresponding to each target sub-pixel, the third sub-functional electrode portion is coupled to the second sub-functional electrode portion through the first conductive connection portion; in the functional electrodes corresponding to each sub-pixel located in the same touch sub-area, along the extending direction of the gate line, adjacent third sub-functional electrode portions are coupled to each other through the second conductive connecting portion; common electrodes located in the same touch sub-area are multiplexed as touch electrode units in the touch sub-area.

In some embodiments, the first conductive connection portion and the second conductive connection portion are arranged in the same layer and made of the same material as the functional electrode.

In some embodiments, the array substrate further comprises a plurality of compensation signal lines, and the plurality of compensation signal lines correspond to non-target sub-pixel columns in the plurality of sub-pixel columns in a one-to-one correspondence, orthographic projection of the compensation signal line on the substrate overlaps orthographic projection of the opening area of each sub-pixel in the corresponding non-target sub-pixel column on the substrate; the orthographic projection of the compensation signal line on the substrate, the orthographic projection of the second sub-functional electrode portion corresponding to each sub-pixel in the corresponding non-target sub-pixel column on the substrate have a second overlapping area, the compensation signal line is coupled to the second sub-function electrode portion corresponding to each sub-pixel in the corresponding non-target sub-pixel column through a second via hole in the second overlapping area.

In some embodiments, the third sub-function electrode portion is electrically connected to the second sub-function electrode portion; the array substrate further includes: a third conductive connection portion couple to the two third sub-functions electrode portions that are adjacent along the extension direction of the gate line and located in the same touch sub-area; common electrodes located in the same touch sub-area are multiplexed as touch electrode units in the touch sub-area.

In some embodiments, the array substrate further includes: a plurality of compensation patterns, the plurality of compensation patterns correspond to non-target sub-pixel columns included in a plurality of the touch sub-areas in a one-to-one correspondence, and each compensation pattern is coupled to the second sub-function electrode portion corresponding to each non-target sub-pixel in the corresponding non-target sub-pixel column; orthographic projection of each compensation pattern on the substrate partially overlaps orthographic projection of the opening area of the corresponding non-target sub-pixel on the substrate; each compensation pattern and the touch signal line are arranged in the same layer and made of the same material, and have the same extension direction as the touch signal line.

In some embodiments, the touch signal line and the data line are arranged in the same layer and made of the same material.

In some embodiments, each sub-pixel includes a pixel electrode located on the substrate; the pixel electrode has a plurality of slits, and the extending direction of the plurality of slits is the same as the extension direction of the data line.

In some embodiments, the orthographic projection of the touch signal line on the substrate covers orthographic projection of at least one slit included in each pixel electrode in the corresponding target sub-pixel column on the substrate.

In some embodiments, the touch signal line has a width of 4 μm-8 μm in a direction perpendicular to the extension direction of the touch signal line.

In some embodiments, the slit has a width of 2 μm-4 μm in a direction perpendicular to the extension direction of the slit.

In some embodiments, the orthographic projection of the touch signal line on the substrate, the orthographic projection of the opening area of each sub-pixel in the corresponding target sub-pixel column on the substrate have a third overlapping area, and the ratio of an area of the third overlapping area to an area of the opening area of the sub-pixel is 4%-8%.

In some embodiments, the touch electrode layer and the pixel electrode are stacked and the touch electrode layer is located between the substrate and the pixel electrode.

In some embodiments, the orthographic projection of the first sub-functional electrode portion on the substrate, the orthographic projection of the second sub-functional electrode portion on the substrate, and the orthographic projection of the third sub-function electrode portion on the substrate are all located on the periphery of the orthographic projection of the pixel electrode in the corresponding sub-pixel on the substrate.

In some embodiments, the plurality of sub-pixels includes a plurality of sub-pixel rows, and each sub-pixel row includes a plurality of the sub-pixels arranged along the extending direction of the gate lines; the gate lines correspond to the sub-pixel rows in a one-to-one correspondence, and the gate line and the sub-pixel driving circuit included in each sub-pixel in the corresponding sub-pixel row are coupled; the orthographic projection of the first sub-function electrode portion on the substrate, the orthographic projection of the second sub-function electrode portion on the substrate, the orthographic projection of the third sub-function electrode portion on the substrate, and the orthographic projection of the corresponding gate line on the substrate enclose the opening area of the corresponding sub-pixel together.

In some embodiments, the first sub-function electrode portion, the second sub-function electrode portion, and the third sub-function electrode portion are in the same layer and made of a same material as the gate line.

In some embodiments, the orthographic projection of the first sub-function electrode portion on the substrate partially overlaps the orthographic projection of the data line on the first side on the substrate; and/or, the orthographic projection of the second sub-function electrode portion on the substrate partially overlaps the orthographic projection of the data line on the second side on the substrate.

In some embodiments, the orthographic projection of the first sub-functional electrode portion on the substrate is located between the orthographic projection of the opening area of the sub-pixel on the substrate and the orthographic projection of the data line on the first side on the substrate; and/or, the orthographic projection of the second sub-function electrode portion on the substrate is located between the orthographic projection of the opening area of the sub-pixel on the substrate and the orthographic projection of the data line on the second side on the substrate.

In a second aspect, a display device includes the above array substrate.

In some embodiments, the orthographic projection of the first sub-functional electrode portion of the functional electrode in the array substrate on the substrate partially overlaps the orthographic projection the data line on the first side on the substrate, the orthographic projection of the second sub-function electrode portion of the functional electrode in the array substrate on the substrate partially overlaps the orthographic projection of the data line on the second side on the substrate; the display device further includes: an opposite substrate arranged opposite to the array substrate, the opposite substrate is provided with black matrix patterns corresponding to the data lines in a one-to-one correspondence, and the orthographic projection of the black matrix pattern on the substrate coincides with the orthographic projection of a first part of the corresponding data line on the substrate, the orthographic projection of the first part of the corresponding data line on the substrate does not overlap the orthographic projection of the first sub-function electrode portion on the substrate, and does not overlaps the orthographic projection of the second sub-function electrode portion on the substrate.

In some embodiments, the orthographic projection of the first sub-functional electrode portion of the functional electrode in the array substrate on the substrate is located between the orthographic projection of the opening area of the sub-pixel in the array substrate on the substrate and orthographic projection of the data line on the first side on the substrate; the orthographic projection of the second sub-functional electrode portion of the functional electrode in the array substrate on the substrate is located between the orthographic projection of the opening area of the sub-pixel on the substrate and the orthographic projection of the data line on the second side on the substrate; the display device further includes: an opposite substrate arranged opposite to the array substrate, the opposite substrate is provided with black matrix patterns corresponding to the data lines in a one-to-one correspondence, and the orthographic projection of the black matrix patterns on the substrate covers the orthographic projection of the corresponding data line on the substrate; the orthographic projection of the black matrix pattern on the substrate partially overlaps the orthographic projection of the first sub-function electrode portion adjacent to the corresponding data line on the substrate; and/or, the orthographic projection of the black matrix pattern on the substrate partially overlaps the orthographic projection of the second sub-function electrode portion adjacent to the corresponding data line on the substrate.

BRIEF DESCRIPTION OF THE DRAWINGS

The drawings described herein are used to provide a further understanding of the present disclosure and constitute a part of the present disclosure. The exemplary embodiments and descriptions of the present disclosure are used to explain the present disclosure, and do not constitute an improper limitation of the present disclosure.

DETAILED DESCRIPTION

Figure 1:
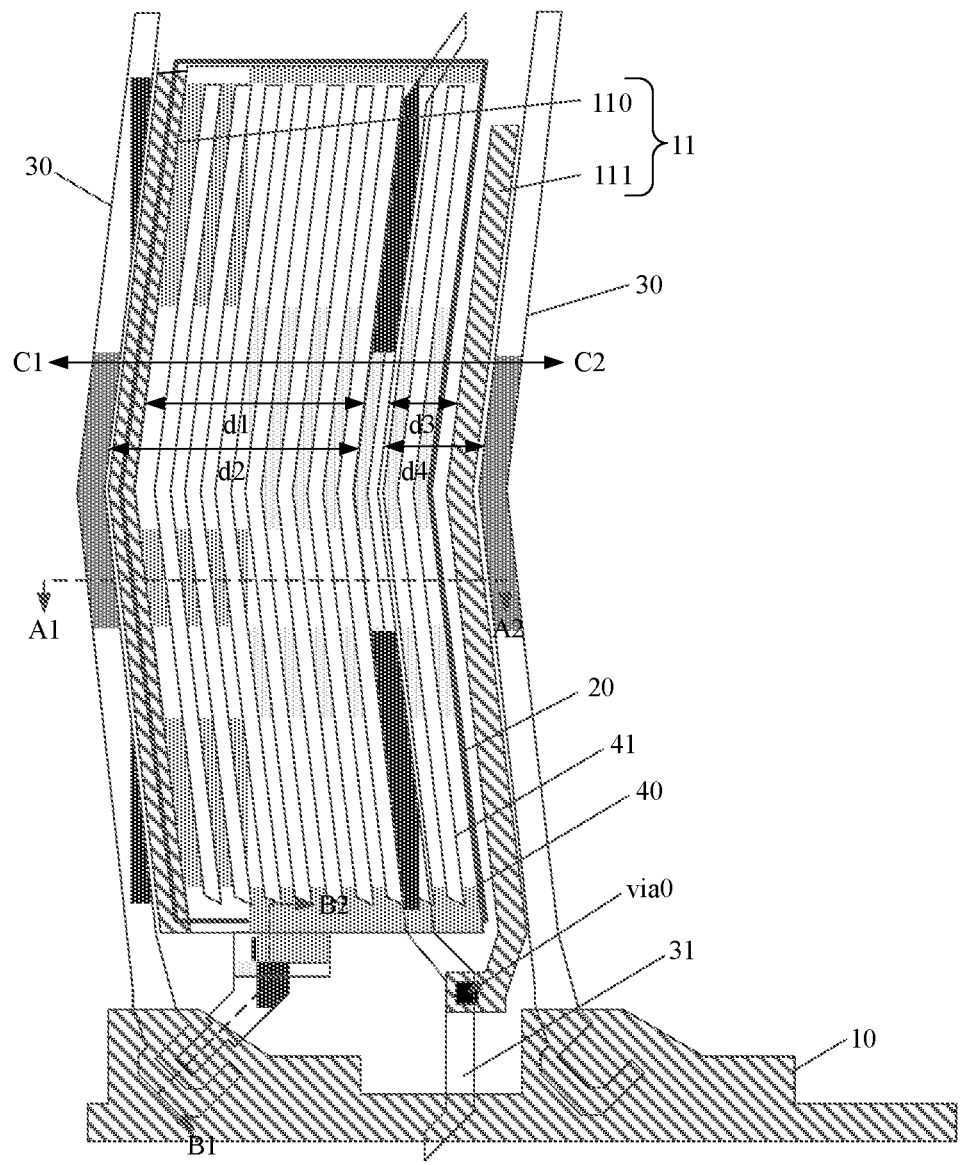
FIG. 1 is a schematic diagram of a first layout of an array substrate provided by an embodiment of the present disclosure.

In order to further explain the array substrate and the display device provided by the embodiments of the present disclosure, a detailed description will be given below in conjunction with the accompanying drawings.

The present disclosure discloses an array substrate, a touch electrode layer and touch signal lines are integrated inside the array substrate, so that when the array substrate is used to manufacture a liquid crystal display panel, the liquid crystal display panel integrates the touch control electrode layer and the touch signal lines for implementing the touch functions inside the liquid crystal display panel to realize a liquid crystal touch display panel with a full in cell touch structure. The liquid touch display panel with the full in cell touch structure integrates touch function and display function, which can realize one-stop seamless production, and has advantages of integration, light weight, low cost, low power consumption and high image quality and Multi-Touch.

When the touch electrode layer and the touch signal lines are integrated inside the array substrate, the touch signal lines and the data lines in the array substrate are generally arranged side by side in an non-opening area between adjacent columns of sub-pixels, and because the touch signal lines and the data lines are arranged in the same layer and made of the same material, so the distance between the data line and the touch signal line in the same non-opening area needs to be widened (currently the distance between the data line and the touch signal line in the same non-opening area is generally more than 6.5 µm) to avoid short circuit between the data line and the touch signal line, but this method will reduce the aperture ratio of the liquid crystal display panel, which is not conducive to improve the display quality of the liquid crystal display panel.

Based on the above problems, referring to FIGS. 1 to 7, an embodiment of the present disclosure provides an array substrate, including: a substrate 60, two adjacent data lines 30, a gate line 10, a sub-pixel, and a touch signal line 31, a functional electrode 11 and a touch electrode unit; the two adjacent data lines 30 are located on the substrate 60; the gate line 10 is located on the substrate 60 and crosses the two data lines 30. The sub-pixel is located in an area enclosed by the gate line 10 and the two data lines 30; the touch signal line 31 is located on the substrate 60 and extends in the same direction as the data line 30, the orthographic projection of the touch signal line 31 on the substrate 60 partially overlaps the orthographic projection of the opening area of the sub-pixel on the substrate 60; the touch electrode unit is located on the substrate 60 and is coupled to the touch signal line 31.

The functional electrode 11 is located on the substrate 60, the functional electrode 11 includes a first sub-functional electrode portion 110 and a second sub-functional electrode portion 111, the extension direction of the first sub-functional electrode portion 110, and the extension direction of the second sub-functional electrode portion 111 is the same as the extension direction of the data line 30, the first sub-functional electrode portion 110 is located on the first side of the opening area of the sub-pixel, and the second sub-functional electrode portion 111 is located on the second side of the opening area of the sub-pixel, and the first side and the second side are opposite to each other along a direction perpendicular to the extension direction the data line 30; along the extension direction of the gate line and on the same straight line, the distance between the orthographic projection of the first sub-function electrode portion 110 on the substrate 60 and the orthographic projection of the touch signal line 31 on the substrate 60 is smaller than the distance between the orthographic projection of the data line 30 on the first side on the substrate 60 and the orthographic projection of the touch signal line 31 on the substrate 60; along the extension direction of the gate line and on the same straight line, the distance between the orthographic projection of the second sub-function electrode portions 111 on the substrate 60 and the orthographic projection of the touch signal line 31 on the substrate 60 is smaller than the distance between the orthographic projection of the data line 30 on the second side on the substrate 60 and the orthographic projection of the touch signal line 31 on the substrate 60.

Specifically, in the array substrate, the material of the substrate 60 can be selected according to actual needs. Illustratively, a glass substrate can be selected, but it is not limited to this. The data line 30 is arranged to cross the gate line 10. For example, the data line 30 extends along the Y direction, and the gate line 10 extends along the X direction.

The gate line 10 and the two data lines 30 can enclose a sub-pixel area, the sub-pixel is located in the sub-pixel area, and the array substrate further includes a sub-pixel driving circuit corresponding to the sub-pixel, the sub-pixel driving circuit includes a driving transistor.

The opening area corresponding to the sub-pixel is an actual light-transmitting area of the sub-pixel, and the non-opening area corresponding to the sub-pixel is a non-light-transmitting area corresponding to the sub-pixel. The opening area in the liquid crystal display panel of the same size is larger, the aperture ratio of the liquid crystal display panel is higher, and the display quality of the liquid crystal display panel is better. The non-opening area is located at the periphery of the opening area, and the sub-pixel driving circuits corresponding to the sub-pixels are all located in the non-opening area corresponding to the sub-pixel, and the gate lines 10 and data lines 30 included in the array substrate are also located in the non-opening area.

One end of the touch signal line 31 is coupled to the touch electrode unit, and the other end of the touch signal line 31 can be coupled to a chip that is subsequently bound on the array substrate. After the array substrate and the opposite substrate are arranged opposite to each other to form a liquid crystal display panel, when a touch operation occurs in the touch area of the liquid crystal display panel, the touch operation can change the touch signal formed on the touch electrode unit in the array substrate, and the touch signal line 31 is used to transmit the touch signal collected on the touch unit to the chip, and the chip receives the touch signal from each of the touch signal lines 31 and determines the specific location of the touch.

The orthographic projection of the touch signal line 31 on the substrate 60 can overlap the orthographic projection of the opening area of the sub-pixel on the substrate 60; under this arrangement, the touch signal line 31 is located in the opening area of the sub-pixel, so that the touch signal line 31 is far away from the data line 30, and the short circuit between the touch signal line 31 and the data line 30 is not considered. This arrangement can effectively reduce the area of the non-opening area around the sub-pixels, thereby increasing the pixel aperture ratio of the liquid crystal display panel formed by the array substrate by about 2%.

Moreover, when the touch signal line 31 is arranged in a non-opening area, when the array substrate and the opposite substrate are arranged oppositely to form a cell, the accuracy of the cell needs to be considered from the touch signal line 31. Therefore, it is also necessary to increase the area of the black matrix pattern on the opposite substrate. In the array substrate provided by the embodiment of the present disclosure, the orthographic projection of the touch signal line 31 on the substrate 60 partially overlaps the orthographic projection of the opening area of the sub-pixel on the substrate 60, so that when the array substrate and the opposite substrate are arranged oppositely to form a cell, there is no need to consider the accuracy of the cell from the touch signal line 31, thereby effectively reducing the area of the black matrix pattern on the opposite substrate.

The structure, material and specific position of the functional electrode 11 can be selected according to actual needs. Illustratively, the functional electrode 11 includes a first sub-functional electrode portion 110 and a second sub-functional electrode portion 111. The extension direction of a sub-function electrode portion 110 and the extension direction of the second sub-function electrode portion 111 are the same as the extension direction of the data line 30; the first sub-function electrode portion 110 and the second sub-function electrode portion 111 can be made of materials with light-shielding properties, such as metal materials, but not limited to this.

When the positions of the first sub-function electrode portion 110 and the second sub-function electrode portion 111 are set, the first sub-function electrode portion 110 may be arranged on the first side of the opening area of the sub pixel, the second sub-function electrode portion 111 is arranged on the second side of the opening area of the sub-pixel, and the first side and the second side are opposite to each other along the extending direction perpendicular to the data line 30. Under this arrangement, the first sub-functional electrode portion 110 and the second sub-functional electrode portion 111 will not overlap the opening area of the sub-pixel in a direction perpendicular to the substrate, which ensures the light exiting efficiency of the opening area.

Further, as shown in FIG. 1, along the extending direction of the gate line 10 and on the same straight line (the C1-C2 direction in FIG. 1), and the distance d1 between the orthographic projection of the first sub-function electrode portion 110 on the substrate 60 and the orthographic projection of the touch signal line 31 on the substrate 60 is smaller than the distance d2 between the orthographic projection of the data line 30 on the first side on the substrate 60 and the orthographic projection of the touch signal line 31 on the substrate 60, so that at least part of the first sub-function electrode portion 110 can be located between the opening area of the sub-pixel and the data line. Similarly, the distance d3 between the orthographic projection of the second sub-function electrode portion 111 on the substrate 60 and the orthographic projection of the touch signal line 31 on the substrate 60 is smaller than the distance d4 between the orthographic projection of the data line 30 on the second side on the substrate 60 and the orthographic projection of the touch signal line 31 on the substrate 60, so that at least part of the second sub-function electrode portion 111 can be located between the opening area of the sub-pixel and the data line; when the first sub-function electrode portion 110 and the second sub-function electrode portion 111 are under the above arrangement, when the first sub-function electrode portion 110 and the second sub-function electrode portion 111 are made of light-shielding material, the first sub-function electrode portion 110 and the second sub-function electrode portion 111 can shield the non-opening area of the sub-pixel. In this way, when the array substrate and the opposite substrate are arranged oppositely to form a liquid crystal display panel, the area of the black matrix pattern on the opposite substrate can be effectively reduced.

As shown in FIG. 1, in some embodiments, along the extending direction of the gate line 10 and on the same straight line, the distance between the orthographic projection of the first sub-function electrode portion 110 on the substrate 60 and the orthographic projection of the touch signal line 31 on the substrate 60 is greater than the distance between the orthographic projection of the second sub-function electrode 111 on the substrate 60 and the orthographic projection of the touch signal line 31 on the substrate 60.

Specifically, when it is ensured that the orthographic projection of the touch signal line 31 on the substrate 60 overlaps the orthographic projection of the opening area of the sub-pixel on the substrate 60, along the extending direction of the gate line 10 is on the same straight line (the C1-C2 direction in FIG. 1), the distance dl between the orthographic projection of the first sub-function electrode portion 110 on the substrate 60 and the touch signal line 31 on the substrate is greater than the distance d3 between the orthographic projection of the second sub-function electrode portion 111 on the substrate 60 and the orthographic projection of the touch signal line 31 on the substrate 60. In this way, along the extending direction of the gate line 10 and on the same straight line, the first sub-function electrode portion 110 and the second sub-function electrode portion 111 have approximately the same distance from the opening area, thereby avoiding the touch signal line 31 being located exactly in the middle of the opening area, and ensuring the light exiting effect of the sub-pixels.

Figure 2:
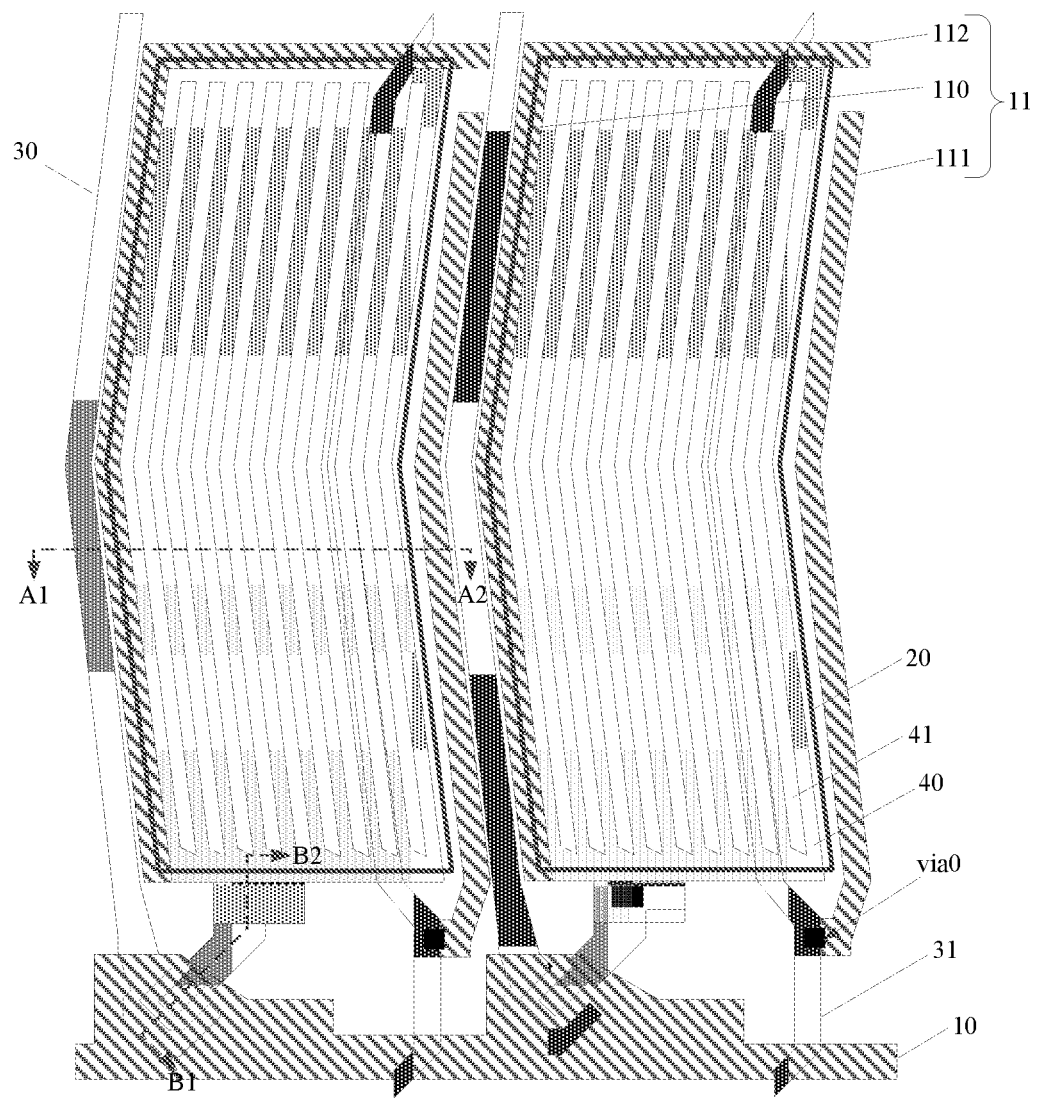
FIG. 2 is a schematic diagram of a second layout of the array substrate provided by an embodiment of the present disclosure.
Figure 3:
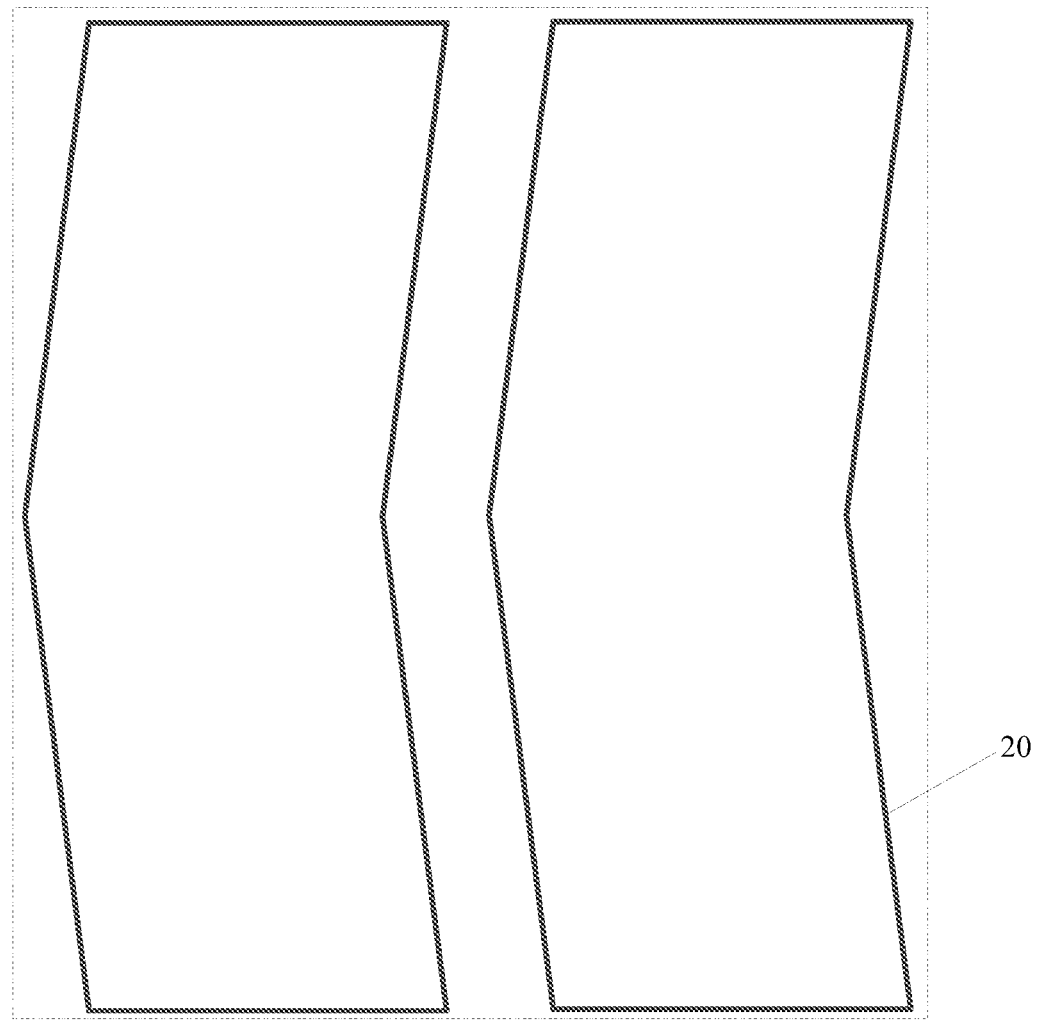
FIGS. 3 to 6 are schematic diagrams of film layers corresponding to the second layout in FIG. 2.
Figure 9:
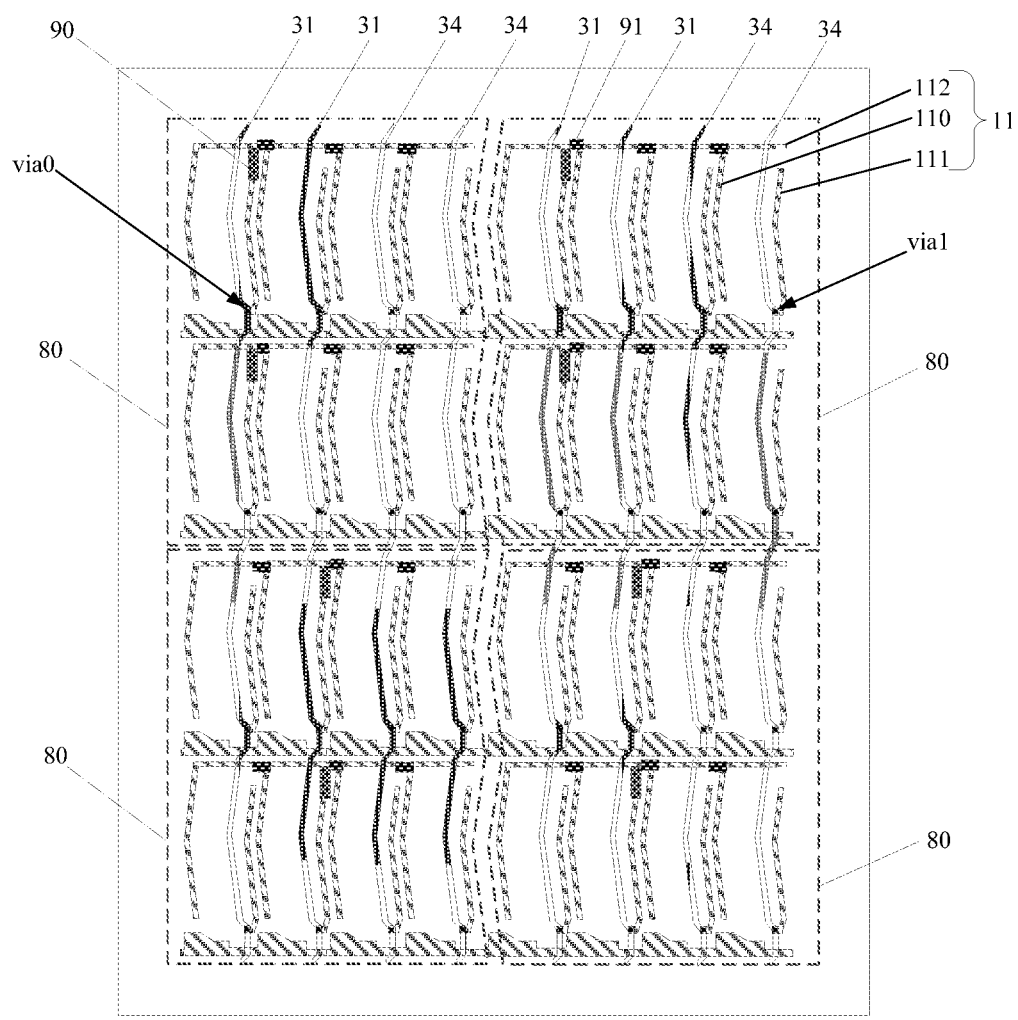
FIG. 9 is a first schematic diagram showing coupling of sub-function electrode portions in a same touch sub-area provided by an embodiment of the present disclosure.

As shown in FIGS. 2 and 9, in some embodiments, the array substrate includes: a plurality of the gate lines 10, a plurality of the data lines 30, and a plurality of the sub-pixels; and a plurality of the gate lines 10 and the plurality of data lines 30 enclose a plurality of sub-pixel areas, and the plurality of sub-pixels are located in the plurality of sub-pixel areas in a one-to-one correspondence; the plurality of sub-pixels includes a plurality of sub-pixel columns, and the sub-pixel column includes a plurality of the sub-pixels arranged along the extending direction of the data line 30.

The array substrate further includes: a touch electrode layer and a plurality of touch signal lines 31; the touch electrode layer is disposed on a touch area of the array substrate, and the touch area includes a plurality of touch sub-areas 80, the touch electrode layer includes a plurality of the touch electrode units, and the touch electrode units are located in the touch sub-areas 80 in a one-to-one correspondence; a plurality of the touch signal lines 31 are coupled to a plurality of touch electrode units in a one-to-one correspondence; the touch signal lines 31 correspond to target sub-pixel columns in the plurality of sub-pixel columns in a one-to-one manner, and the orthographic projection of touch signal lines 31 on the substrate 60 partially overlaps the orthographic projection of the opening area of each sub-pixel in the target sub-pixel column on the substrate 60.

The array substrate further includes: a plurality of the functional electrodes 11 corresponding to the plurality of sub-pixels in a one-to-one manner, the orthographic projection of the touch signal line 31 on the substrate 60, and the orthographic projection of the second sub-function electrode portion 111 corresponding to each target sub-pixel in the corresponding target sub-pixel column on the substrate have a first overlapping area, and the touch signal line 31 is coupled to the second sub-function electrode portion 111 corresponding to at least a part of the target sub-pixel through the first via hole on at least part of the first overlapping area, target sub-pixels included in the target sub-pixel column corresponding to the touch signal line 31 is located the touch sub-area corresponding to the touch signal line 31.

Specifically, the array substrate may include a plurality of the gate lines 10 and a plurality of the data lines 30, the plurality of gate lines 10 and the plurality of data lines 30 are arranged crossing to each other to form a plurality of sub-pixel areas, the plurality of sub-pixels are located in the plurality of sub-pixel areas in a one-to-one correspondence.

The touch electrode layer included in the array substrate may be located in a touch area of the array substrate, the touch electrode layer includes a plurality of touch electrode units separated to each other, and the plurality of touch electrode units may be arranged in an array, but not limited to this. The touch area may be divided into a plurality of touch sub-areas 80, and the touch electrode units are located in the touch sub-areas 80 in a one-to-one correspondence. It is worth noting that the specific position of the touch area can be set according to actual needs. For example, after the array substrate forms a liquid crystal display panel, the touch area overlaps the entire display area of the liquid crystal display panel; or the touch area is located in the display area and only overlaps a designated area in the display area.

Each of the touch electrode units is coupled to a corresponding touch signal line 31, and one end of the touch signal line 31 away from the touch electrode unit can be coupled to a chip subsequently bound on the array substrate . After the array substrate and the opposite substrate are arranged oppositely to form a liquid crystal display panel, when a touch operation occurs in the touch area of the liquid crystal display panel, the touch operation can change the touch signal formed on the touch electrode unit in the array substrate, and the touch signal line 31 is used to transmit the touch signal collected on the touch unit to the chip, and the chip receives the touch signal from each of the touch signal lines 31, and determines the specific position of the touch.

The orthographic projection of the touch signal line 31 on the substrate 60 can overlap the orthographic projection of the opening area of each sub-pixel in the corresponding target sub-pixel column on the substrate 60; under this arrangement, the touch signal line 31 is located in the opening area of a part of sub-pixels, so that the touch signal line 31 is far away from the data line 30, and the short circuit between the touch signal line 31 and the data line 30 is not considered. This arrangement can effectively reduce the area of the non-opening area around the sub-pixels, thereby increasing the pixel aperture ratio of the liquid crystal display panel formed by the array substrate by about 2%.

In the array substrate provided by the embodiment of the present disclosure, the orthographic projection of the touch signal line 31 on the substrate 60 partially overlaps the orthographic projection of the opening area of each sub-pixel of the corresponding target sub-pixel column on the substrate 60, so that when the array substrate and the opposite substrate are arranged oppositely to form a cell, there is no need to consider the accuracy of the cell from the touch signal line 31, thereby effectively reducing the area of the black matrix pattern on the opposite substrate.

The above arrangement of the array substrate further includes: a plurality of functional electrodes 11 having a light-shielding effect corresponding to the plurality of sub-pixels in a one-to-one manner, and the orthographic projection of the touch signal line 31 on the substrate 60 and the orthographic projection of the second sub-functional electrode portion 111 corresponding to each target sub-pixel in the corresponding target sub-pixel column on the substrate have a first overlapping area, so that the touch signal line 31 can be coupled to the second sub-function electrode 111 corresponding to at least a part of the target sub-pixels through the first via hole provided in at least a part of the first overlapping area.

The second sub-function electrode portion 111 can be made of conductive material, and can be specifically used as a shielding bar in the array substrate. The touch signal line 31 is coupled to the second sub-function electrode portion 111 corresponding to at least a part of the target sub-pixels, so that the touch signal line 31 has a smaller resistance, which is more beneficial to reduce the loss of the touch signal line 31 during signal transmission.

As shown in FIG. 2, in some embodiments, the functional electrode 11 further includes a third sub-function electrode portion 112, and the extension direction of the third sub-function electrode portion 112 is the same as the extension direction of the gate line 10, the third sub-function electrode portion 112 is electrically connected to the first sub-function electrode portion 110.

Specifically, the functional electrode 11 further includes a third sub-functional electrode portion 112, and the third sub-functional electrode portion 112 can also be made of a metal material with light-shielding performance. In actual layout of the third sub-functional electrode portion 112, the extension direction of the third sub-function electrode portion 112 can be set to be the same as the extension direction of the gate line 10, and one end of the third sub-function electrode portion 112 close to the first sub-function electrode portion 110 is electrically connected to the first sub-function electrode portion 110, and at the same time, the orthographic projection of the first sub-function electrode portion 110 on the substrate, and the orthographic projection of the second sub-function electrode portion 111 on the substrate, and the orthographic projection of the third sub-functional electrode portion 112 on the substrate are all located on the periphery of the orthographic projection of the opening area of the sub-pixel on the substrate. In this way, the third sub-functional electrode portion 112 may further shield the non-opening area of the sub-pixels, thereby further reducing the area of the black matrix pattern provided on the opposite substrate.

As shown in FIGS. 2 and 9, in some embodiments, each of the sub-pixels further includes a common electrode 20; the common electrode 20 is located between the corresponding functional electrode 11 and the substrate 60, and is in direct contact with the first sub-function electrode portion 110 and the third sub-function electrode portion 113 of the corresponding functional electrode 11.

Specifically, the sub-pixel provided in the above embodiment may further include a common electrode 20, and the specific position of the common electrode 20 can be set according to actual needs. For example, the common electrode 20 is set between the corresponding functional electrode 11 and the substrates 60, this arrangement is more conducive to improving the transmittance of the liquid crystal display panel.

In addition, when the first sub-functional electrode portion 110 and the third sub-functional electrode portion 113 included in the functional electrode 11 are both made of a conductive material, the common electrode 20 is in direct contact with the first sub-function electrode portion 110 and the third sub-function electrode portion 113 of corresponding functional electrode 11, which can effectively reduce the resistance of the common electrode 20 and reduce the loss generated by the common electrode 20.

As shown in FIG. 2, in some embodiments, the orthographic projection of the touch signal line 31 on the substrate 60 and the orthographic projection of the second sub-function electrode portion 111 corresponding to each sub-pixel of the corresponding target sub-pixel column on the substrate 60 have a first overlapping area, and the touch signal line 31s is coupled to second sub-function electrode portion 111 corresponding to each sub-pixel of the corresponding target sub-pixel column through the first via hole via0 provided in the first overlapping area.

Specifically, as described above, the orthographic projection of the touch signal line 31 on the substrate 60 and the orthographic projection of the second sub-function electrode portion 111 corresponding to each sub-pixel of the corresponding target sub-pixel column on the substrate 60 have a first overlapping area, and the touch signal line 31 is coupled to second sub-function electrode portion 111 corresponding to each sub-pixel of the corresponding target sub-pixel column through the first via hole via0 provided in the first overlapping area. In the foregoing, the touch signal line 31 is coupled to second sub-function electrode portion 111 corresponding to each sub-pixel of the corresponding target sub-pixel column, so that the touch signal line 31 has a smaller resistance, it is more beneficial to reduce the loss of the touch signal line 31 when transmitting signals.

As shown in FIGS. 2 and 9, in some embodiments, the array substrate further includes: a first conductive connection portion 90 and a second conductive connection portion 91; and among the functional electrodes 11 corresponding to each target sub-pixel, the third sub-function electrode portion 112 is coupled to the second sub-function electrode portion 111 through the first conductive connection portion 90; among functional electrodes 11 corresponding to all sub-pixels located in the same touch sub-area 80, in the extending direction of the gate line 10, the adjacent third sub-functional electrode portions 112 are coupled by the second conductive connection portion 91; the common electrodes 20 located in the same touch sub-area 80 are multiplexed as touch electrode units in the touch sub-area.

Specifically, the target sub-pixels included in the target sub-pixel column corresponding to the touch signal line 31 are located in the touch sub-area 80 corresponding to the touch signal line; and among the functional electrodes 11 corresponding to each target sub-pixel, the third sub-function electrode portion 112 is coupled to the second sub-function electrode portion 111 through the first conductive connection portion 90; among functional electrodes 11 corresponding to all sub-pixels located in the same touch sub-area 80, in the extending direction of the gate line 10, the adjacent third sub-functional electrode portions 112 are coupled by the second conductive connection portion 91; so that all the first sub-function electrode portion 110 and the third sub-function electrode portion 112 located in the same touch sub-area 80 are coupled together, and at the same time, all the first sub-function electrode portions 110 and the third sub-function electrode portions 112 located in the same touch sub-area 80 can be coupled to the corresponding touch signal lines 31 through the second sub-function electrode portions 111 corresponding to the target sub-pixels in the touch sub-area 80; and because the first sub-function electrode portion 110 and the third sub-function electrode portion 112 are both coupled to the corresponding common electrode 20, all the common electrodes 20 in the same touch sub-area 80 are coupled together.

In the array substrate with the above structure, the common electrodes 20 located in the same touch sub-area 80 can be multiplexed as touch electrode units in the touch sub-area 80, thereby avoiding additional fabrication of the touch electrode unit in the array substrate; and because the common electrodes 20 are coupled to the corresponding first and third sub-function electrode portions 110, and the common electrodes 20 located in the same touch sub-area 80 are all coupled together, so that the resistance of the common electrode 20 is low, and the loss is small. Therefore, when the common electrode 20 located in the same touch sub-area 80 is multiplexed as the touch electrode unit in the sub-area 80, the resistance of the touch electrode unit is low, thereby effectively reducing the loss on the touch signal line 31, improving touch sensitivity, and improving product competitiveness and added value as a whole (touch function).

In the case of multiplexing the common electrodes 20 located in the same touch sub-area 80 as touch electrode units in the touch sub-area 80, after using the array substrate to form a liquid crystal display panel, the specific process of using the LCD panel to realize the touch display function is as follows.

In a touch phase, the touch signal line 31 provides a touch signal. When a touch operation occurs in the touch area of the liquid crystal display panel, the touch signal corresponding to the touch electrode unit at the position where the touch operation occurs will change, the touch electrode unit transmits the changed touch signal to the chip through the corresponding touch signal line 31, and the chip determines the specific location of the touch operation based on the changed touch signal.

In a display phase, the touch signal line 31 provides a common electrode signal required for display, and the sub-pixel driving circuit in the array substrate provides driving signals for the corresponding pixel electrodes 40, so that an electric field for driving the deflection of the liquid crystal is generated between the pixel electrode 40 and the common electrode 20, so that the liquid crystal display panel realizes a display function.

In some embodiments, the first conductive connecting portion 90 is made of a conductive material. Illustratively, the first conductive connecting portion 90 and the data line 30 may be arranged in the same layer and made of the same material. When the first conductive connecting portion 90 and the data line 30 are arranged in the same layer and made of the same material, the first conductive connecting portion 90 and the data line 30 can be formed at the same time through a single patterning process, which greatly simplifies the production process of the array substrate and saves production costs.

In some embodiments, the first conductive connecting portion 90, the second conductive connecting portion 91 and the functional electrode 11 may be arranged in the same layer and made of the same material.

Specifically, since the second conductive connection portion 91 is used to couple the two third sub-function electrode portions 112 adjacent to each other along the extension direction of the gate line 10 in the same touch sub-area 80 together, the second conductive connection portion 91 does not need to cross the gate line 10, so that when the second conductive connection portion 91 and the functional electrode 11 (including the first sub-functional electrode portion 110, the second sub-function electrode portion 111 and the third sub-function electrode portion 112) are arranged in the same layer and made of the same material, it can be ensured that no short circuit occurs between the second conductive connection portion 91 and the gate line 10.

In addition, the first conductive connection portion 90, the second conductive connection portion 91 and the functional electrode 11 are arranged in the same layer and made of the same material, so that the first conductive connection portion 90, the second conductive connection portion 91 and the functional electrode 11 are manufactured at the same time, thereby avoiding additional patterning process for the first conductive connection portion 90 and the second conductive connection portion 91, greatly simplifying the manufacturing process of the array substrate and saving the production cost.

As shown in FIG. 9, in some embodiments, the array substrate further includes a plurality of compensation signal lines 34, and the compensation signal lines 34 correspond to non-target sub-pixel columns of the plurality of sub-pixel columns in a one-to-one manner, so the orthographic projection of the compensation signal line 34 on the substrate overlaps the orthographic projection of the opening area of each sub-pixel in the corresponding non-target sub-pixel column on the substrate.

The orthographic projection of the compensation signal line 34 on the substrate, and the orthographic projection of the second sub-functional electrode portion 111 corresponding to each sub-pixel in the non-target sub-pixel column on the substrate have a second overlapping area, the compensation signal line 34 is coupled to the second sub-function electrode portion 111 corresponding to each sub-pixel in the non-target sub-pixel column through the second via hole vial provided in the second overlapping area.

Specifically, a plurality of compensation signal lines 34 may be provided in the array substrate. The compensation signal lines 34 may have the same structure as the touch signal lines 31, and the compensation signal lines can be coupled to the second sub-function electrode portion 111 corresponding to each sub-pixel in the corresponding non-target sub-pixel column through the second via hole vial; the above-mentioned structure of providing a plurality of compensation signal lines 34 makes the touch signal lines 31 and the compensation signal lines 34 can be evenly distributed on the entire array substrate. When the array substrate with this structure is applied to the display panel, it is more beneficial to improve the display uniformity of the display panel.

It is worth noting that in the non-target sub-pixel column, the second sub-functional electrode portion 111 corresponding to each sub-pixel is disconnected from the first sub-functional electrode portion 110 and the third sub-functional electrode portion 112. That is, the second sub-functional electrode portion 111 corresponding to each sub-pixel is insulated from the first sub-functional electrode portion 110 and the third sub-functional electrode portion 112.

In addition, the compensation signal line 34 and the touch signal line 31 can be arranged in the same layer and made of the same material, so that the compensation signal line 34 and the touch signal line 31 can be formed in the same patterning process to avoid an additional patterning process dedicated to the manufacture of the compensation signal line 34, thereby effectively simplifying the manufacturing process of the array substrate and saving production costs.

Figure 10:
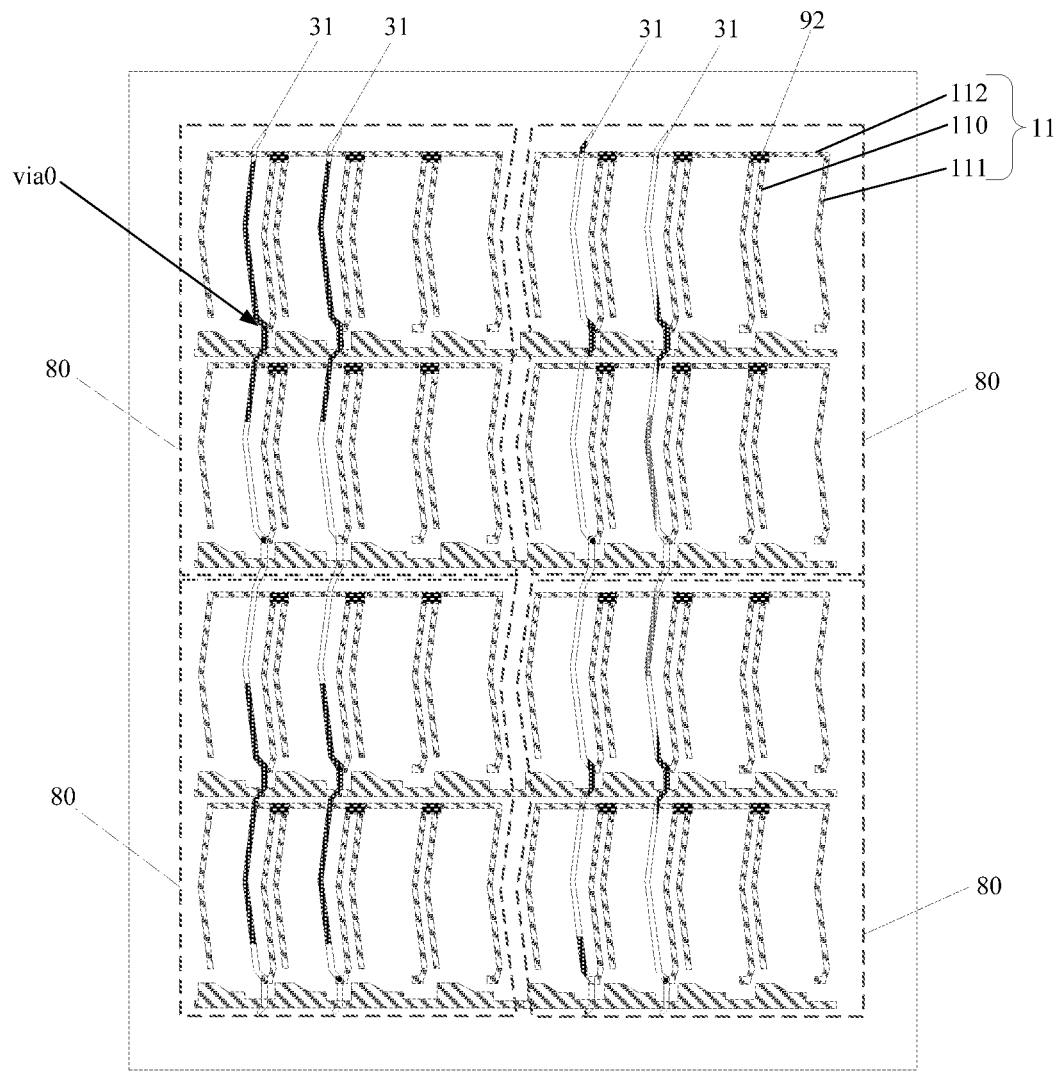
FIG. 10 is a second schematic diagram showing the coupling of sub-function electrode portions in the same touch sub-area provided by an embodiment of the present disclosure.

As shown in FIG. 10, in some embodiments, the third sub-function electrode portion 112 is electrically connected to the second sub-function electrode portion 111; the array substrate further includes: a third conductive connection portion 92, the third conductive connection portion 92 is respectively coupled to the two third sub-function electrode portions 112 adjacent to each other along the extension direction of the gate line 10 in the same touch sub-area 80; the common electrode 20 in the same touch sub-area is multiplexed as the touch electrode unit in the touch sub-area 80.

Specifically, the orthographic projection of the touch signal line 31 on the substrate 60 and the orthographic projection of the second sub-function electrode portion 111 corresponding to each sub-pixel in the corresponding target sub-pixel column on the substrate 60 have a first overlapping area. In this way, the first via hole via0 can be formed in the first overlapping area to realize that the touch signal line 31 is coupled to the second sub-function electrode portion 111 corresponding to each sub-pixel in the corresponding target sub-pixel column through the first via hole via0 in the first overlapping area. In the foregoing, the touch signal line 31 is coupled to the second sub-function electrode portion 111 corresponding to each sub-pixel in the corresponding target sub-pixel column, so that the touch signal line 31 has a smaller resistance, it is more beneficial to reduce the loss of the touch signal line 31 when transmitting signals.

In the foregoing, the target sub-pixels included in the target sub-pixel column corresponding to the touch signal line 31 are further set to be located in the touch sub-area 80 corresponding to the touch signal line; and two third sub-function electrode portions 112 adjacent to each other along the extension direction of the gate line 10 in the same touch sub-area 80 of the third conductive connection portion 92 are coupled to each other; so that all the functional electrodes 11 (including the first sub-functional electrode portion 110, the second sub-functional electrode portion 111, and the third sub-functional electrode portion 112) are coupled together, and at the same time all the functional electrodes 11 located on the same touch sub-area 80 can be coupled to the corresponding touch signal line 31; since the functional electrodes 11 are all coupled to the corresponding common electrode 20, all functional electrodes 11 located in the same touch sub-area 80 are coupled together.

It can be seen that in the array substrate with the above structure, the common electrodes 20 located in the same touch sub-area 80 can be multiplexed as touch electrode units in the touch sub-area 80, thereby avoiding additional process for manufacturing the touch electrode unit; and, since the common electrodes 20 are all coupled to the corresponding functional electrodes 11, and the common electrodes 20 located in the same touch sub-area 80 are all coupled together, so that the resistance of the common electrode 20 is low, and the loss is small. Therefore, when the common electrode 20 located in the same touch sub-area 80 is multiplexed as the touch electrode unit in the touch sub-area 80, the resistance of the touch electrode unit is low, thereby effectively reducing the loss on the touch signal line 31, improving the touch sensitivity, and improving product competitiveness and added value (touch function).

In addition, it should be noted that when the common electrodes 20 located in the same touch sub-area 80 are multiplexed as touch electrode units in the touch sub-area 80, the touch signal lines 31 can be coupled to the touch electrode unit by various ways; exemplary, since the common electrode 20 is coupled to the corresponding functional electrode 11, the touch signal line 31 can be coupled to the second sub-function electrode portion 111 in the corresponding touch sub-area 80, thereby realizing the coupling of the touch signal line 31 with the corresponding touch electrode unit. In more detail, when the orthographic projection of the touch signal line 31 on the substrate 60 overlaps the orthographic projection of the opening area of a sub-pixel column on the substrate 60, and when at least part of the target sub-pixels of the sub-pixel column are located in the touch sub-area 80 corresponding to the touch signal line 31, the orthographic projection of the touch signal line 31 on the substrate 60 and the orthographic projection of the second sub-functional electrode portion 111 corresponding to at least one target sub-pixel in the sub-area 80 on the substrate 60 have a first overlapping area, and a first via hole is provided in the first overlapping area, so that the touch signal line 31 is coupled to the second sub-function electrode portion 111 corresponding to the at least one target sub-pixel through the first via hole via0 provided in the first overlapping area.

In the array substrate provided in the above embodiment, the touch signal line 31 is coupled to the corresponding second sub-function electrode portion 111 to realize the coupling of the touch signal line 31 and the corresponding touch electrode unit, so that the touch signal line 31 can be coupled to the corresponding touch electrode unit in the non-opening area, thereby avoiding making the via hole for coupling the touch signal line 31 and the touch electrode unit in the opening area. When the array substrate is applied to the liquid crystal display panel, the display quality of the liquid crystal display panel is effectively improved.

Figure 11:
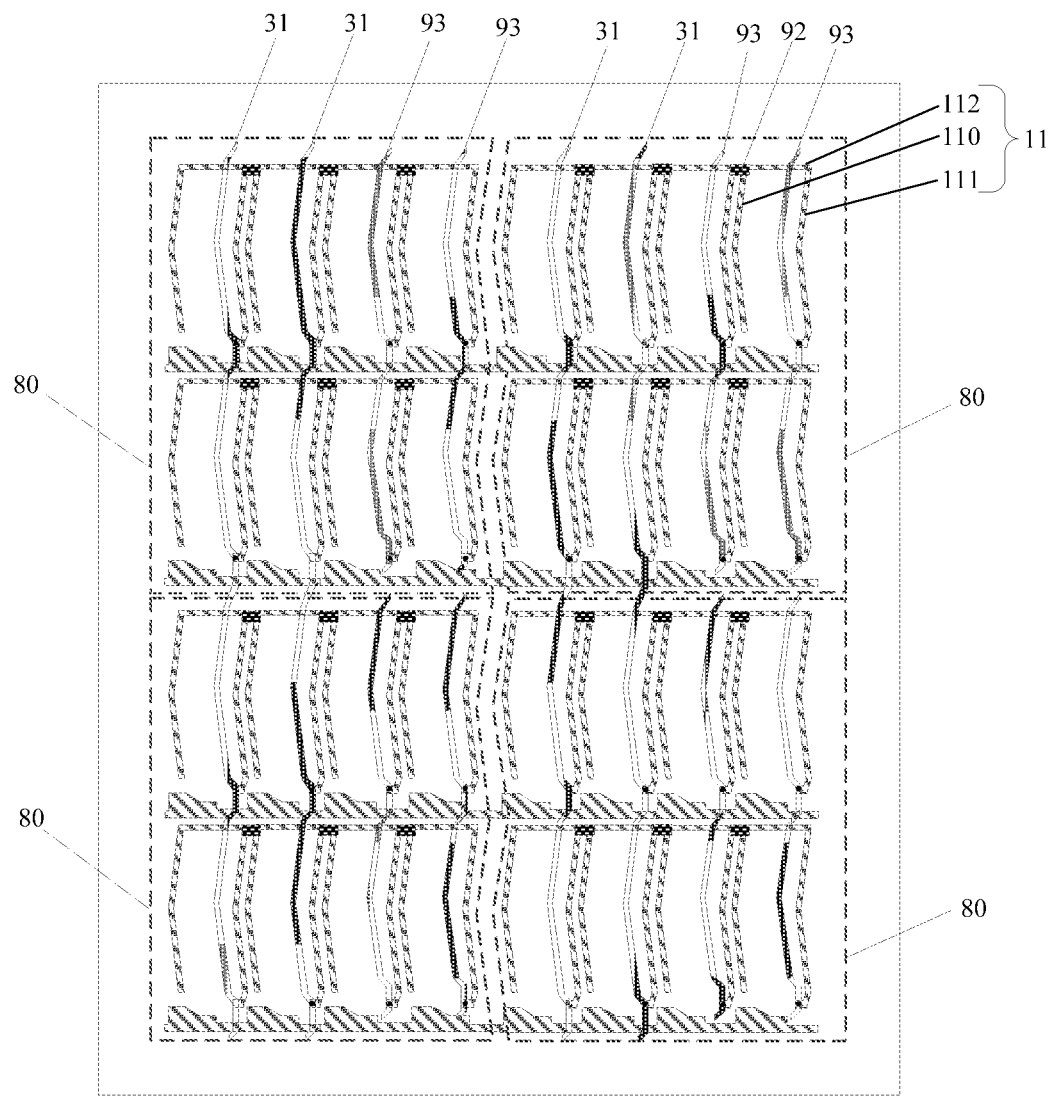
FIG. 11 is a schematic diagram of a compensation pattern in the same touch sub-area provided by an embodiment of the present disclosure.

As shown in FIG. 11, in some embodiments, the array substrate further includes: a plurality of compensation patterns 93, the plurality of compensation patterns 93 correspond to the non-target sub-pixel columns included in the plurality of touch sub-areas 80 in a one-to-one manner, and each compensation pattern 93 is coupled to the second sub-function electrode portion 111 corresponding to each non-target sub-pixel in the corresponding non-target sub-pixel column.

The orthographic projection of each compensation pattern 93 on the substrate 60 partially overlaps with the orthographic projection of the corresponding opening area of the non-target sub-pixel on the substrate; each compensation pattern 93 and the touch signal line 31 are arranged in the same layer and made of the same material, and have the same extending direction as the touch signal line 31.

Specifically, a plurality of compensation patterns 93 with conductive properties are arranged in the array substrate, and each compensation pattern 93 is coupled to the second sub-function electrode portion 111corresponding to each non-target sub-pixel in the corresponding non-target sub-pixel column. The resistance of the common electrode 20 is reduced and the loss generated by the common electrode 20 is reduced.

In addition, the orthographic projection of each compensation pattern 93 on the substrate 60 overlaps the orthographic projection of the corresponding opening area of the non-target sub-pixel on the substrate 60, and each compensation pattern 93 and the touch signal line 31 have the same extension direction, so that the touch signal line 31 and the compensation pattern 93 can be evenly distributed on the entire array substrate. When the array substrate of this structure is applied to a display panel, it is more conducive to improving the display uniformity of the display panel.

In addition, the compensation pattern 93 and the touch signal line 31 can be arranged in the same layer and made of the same material, so that the compensation pattern 93 and the touch signal line 31 can be formed in the same patterning process, thereby avoiding additional patterning process for manufacturing the compensation pattern 93, effectively simplifying the manufacturing process of the array substrate and saving production cost.

When manufacturing the liquid crystal display panel using the array substrate provided by the foregoing embodiments, the following processes are generally used.

An array substrate and an opposite substrate are first fabricated, wherein a driving circuit layer, a common electrode layer, a pixel electrode layer, and a first alignment film are formed on the array substrate. The driving circuit layer includes sub-pixel driving circuits corresponding to the sub-pixels included in the liquid crystal display panel in a one-to-one manner and signal lines for providing various signals to the sub-pixel driving circuits, these signal lines include a plurality of gate lines and a plurality of data lines, the gate lines and the data lines cross to each other and define a plurality of the sub-pixels; the pixel electrode layer includes pixel electrodes corresponding to the sub-pixels in a one-to-one manner, and each of the pixel electrodes is electrically connected to an output electrode of a driving transistor in a corresponding sub-pixel driving circuit; the first alignment film covers the drive circuit layer, the common electrode layer and the pixel electrode layer, and the first alignment film is aligned with a rubbing cloth to form a first alignment layer with grooves in a fixed direction, the opposite substrate is provided with color resist units corresponding to the sub-pixels in a one-to-one manner, a black matrix pattern located around each color resist unit, and a second alignment film covering the color resist unit and the black matrix pattern, the rubbing cloth is used to align the second alignment film to form a second alignment layer with grooves in a fixed direction.

After fabricating the first alignment layer and the second alignment layer, the array substrate and the opposite substrate are arranged oppositely to form a cell, and after forming the cell, the first alignment layer and the second alignment layer are both located inside the cell and in a direction perpendicular to the substrate of the array substrate, the color resist unit is directly opposite to the opening area of the corresponding sub-pixel, and the black matrix pattern can cover the non-opening area around each sub-pixel.

Finally, liquid crystal molecules are injected into the liquid crystal cell formed by the array substrate and the opposite substrate, and the liquid crystal molecules can be arranged in an orderly manner according to the groove directions in the first alignment layer and the second alignment layer.

In order to improve the transmittance of the liquid crystal display panel, in the present disclosure, when manufacturing the liquid crystal display panel, the liquid crystal display panel adopts different display modes. Commonly used display modes include Advanced Super Dimension Switch (ADS) display mode. In one example, in the ADS display mode, each pixel electrode included in the liquid crystal display panel adopts a slit design, and the extending direction of the slit is perpendicular to the extending direction of the data line.

In the above-mentioned ADS display mode, in order to ensure the normal display function of the liquid crystal display panel, it is necessary to set the extension direction of the groove in the alignment layer to be the same as the extension direction of the slit, that is, during the alignment process, the rubbing cloth needs to rub the alignment film along a direction perpendicular to the extension direction of the data line, so that when the rubbing cloth rubs near the data line, it needs to climb at the data line, which will easily lead to a relative large alignment shadow area near the data line, and because this area is prone to light leakage, this area needs to be shielded by the black matrix pattern on the opposite substrate after forming the cell, which leads to an increase in the width of the black matrix pattern perpendicular to the extending direction of the data line, reducing the aperture ratio of the liquid crystal display panel.

Based on the existence of the above problems, the extension direction of the slit can be changed so that the extension direction of the slit is the same as the extension direction of the data line, and the direction of the groove after the alignment layer is aligned is the same as the extension direction of the data lines, so that during the alignment process, thereby avoiding forming the alignment shadow area near the data line, reducing the width of the black matrix pattern used to shield the data line perpendicular to the extending direction of the data line, and improving the aperture ratio of the liquid crystal display panel effectively.

Referring to FIGS. 2-7, in the array substrate provided by the above embodiment, each of the sub-pixels includes a pixel electrode 40 located on the substrate 60; the pixel electrode 40 has a plurality of slits 41, the extending direction of the slit 41 is the same as the extending direction of the data line 30.

Specifically, each of the sub-pixels includes a pixel electrode 40, and the pixel electrode 40 can be made of indium tin oxide material. During the manufacturing process, a plurality of slits 41 can be formed through a patterning process so that the extending direction of the slit 41 is the same as the extending direction of the data line 30. Each pixel electrode 40 is electrically connected to an output electrode of a driving transistor in a corresponding sub-pixel driving circuit, and receives a driving signal provided by the driving transistor.

The process of forming an alignment layer on the array substrate includes: first, forming an alignment material film on a side of the array substrate where the pixel electrode 40 is arranged, and then implementing rubbing alignment using a rubbing cloth along the extension direction of the slit 41 in the pixel electrode 40 (that is, the extension direction of the data line 30) to form the alignment layer with grooves, and the extending direction of the grooves is the same as the extending direction of the slit 41.

According to the specific structure of the above-mentioned array substrate, in the array substrate provided by the embodiment of the present disclosure, the extension direction of the slit 41 in each pixel electrode 40 is the same as the extension direction of the data line 30, so that during the alignment process of the alignment material film on the array substrate, a large rubbing shadow area will not be formed near the data line 30, so when the array substrate provided in the above embodiment and the opposite substrate are arranged opposite to form a liquid crystal display panel, the width of the black matrix pattern used for shielding the data line 30 in the substrate along a direction perpendicular to the extending direction of the data line 30, thereby effectively improving the aperture ratio of the liquid crystal display panel.

In more detail, when a rubbing shadow area is formed near the data line, and when the touch signal line 31 and the corresponding data line 30 are arranged side by side in the non-opening area, the width of an area that needs to be shielded near the data line along a direction perpendicular to the extending direction of the data line can reach about 8.5 µm, thereby resulting in a loss of about 3% in the aperture ratio. Therefore, in the array substrate provided by the foregoing embodiment, the extension direction of the slit in the pixel electrode is the same as the extension direction of the data line, and the touch signal line 31 overlaps the opening area, thereby avoiding forming a rubbing shadow area and considering the need for cell forming accuracy and short-circuit conditions from the touch signal line 31, reducing the width of the area that needs to be shielded at the data line along a direction perpendicular to the extension direction of the data line. As a result, when the array substrate is used for forming the liquid crystal display panel, the pixel aperture ratio of the liquid crystal display panel can be increased by about 3%.

In some embodiments, the touch signal line 31 and the data line 30 extend in the same direction.

Specifically, the extension direction of the touch signal line 31 can be set according to actual needs. For example, the extension direction of the touch signal line 31 is the same as the extension direction of the data line 30, that is, the extending direction of the touch signal line 31 is the same as the extending direction of the slit 41 in the pixel electrode 40, so that when the alignment layer is formed on the array substrate, the rubbing direction of the rubbing cloth is the same as the extending direction of the touch signal line 31, thereby avoiding forming a large rubbing shadow area near the touch signal line 31, and ensuring the display quality of the liquid crystal display panel when the array substrate is applied to the liquid crystal display panel.

In some embodiments, the touch signal line 31 and the data line 30 may be arranged in the same layer and made of the same material.

Specifically, the material selected for the touch signal line 31 and which layer of the array substrate the touch signal line 31 is specifically arranged on can be set according to actual needs. For example, the touch signal line 31 and the data line 30 may be arranged in same layer and made of the same material. Under this arrangement, the touch signal line 31 and the data line 30 may be formed at the same time in the same patterning process, thereby avoiding an additional patterning process for making the touch signal line 31, simplifying the manufacturing process of the array substrate and saving the production cost of the array substrate.

In some embodiments, the orthographic projection of the touch signal line 31 on the substrate 60 overlaps the orthographic projection of at least one of the slits 41 included in each pixel electrode 40 in the corresponding target sub-pixel column on the substrate 60.

Specifically, when the touch signal line 31 overlaps the opening area of the sub-pixel, the orthographic projection of the touch signal line 31 on the substrate 60 can be specifically set to overlap the orthographic projection of at least one slit 41 included in each pixel electrode 40 in the corresponding target sub-pixel column on the substrate 60. Under this arrangement, the touch signal line 31 overlaps the slit 41 as much as possible, thereby reducing the capacitance generated between the touch signal line 31 and the pixel electrode 40.

In some embodiments, the touch signal line 31 may have a width of 4 µm-8 µm in a direction perpendicular to its extension direction, for example, a width of 4 µm, 5 µm, 6 µm, 7 µm, or 8 µm.

In some embodiments, the slit 41 may have a width of 2 µm-4 µm in a direction perpendicular to its extending direction, for example, a width of 2 µm, 2.5 µm, 3 µm, 3.5 µm, or 4 µm.

The touch signal line 31 and the slit 41 are set to the above-mentioned size, so that the signal transmission performance of the touch signal line 31 is ensured, and the overlapping area between the touch signal line 31 and the slit 41 in the direction perpendicular to the substrate is not too large, so that when the array substrate is applied to a display panel, the display panel has a good display quality.

In some embodiments, the orthographic projection of the touch signal line 31 on the substrate 60 and the orthographic projection of the opening area of each sub-pixel in the corresponding target sub-pixel column on the substrate 60 have a third overlapping area, and the ratio of the area of the third overlapping area to the area of the opening area of the sub-pixel is 4%-8%, for example, the area ratio is 4%, 5%, 6%, 7% or 8%.

Specifically, the ratio of the area of the third overlapping area to the area of the opening area of the sub-pixel is 4% to 8%, so that the touch signal line 31 does not shield the opening area too much. Therefore, when the array substrate is applied to a display panel, the display panel has a good display quality.

In some embodiments, the touch electrode layer and the pixel electrode 40 are stacked and arranged between the substrate 60 and the pixel electrode 40.

Since in the array substrate provided by the foregoing embodiment, the touch electrode layer is arranged between the substrate 60 and the pixel electrode 40, after the array substrate and the opposite substrate are arranged oppositely to form a liquid crystal display panel, the touch electrode layer is located inside the liquid crystal display panel, so that the liquid crystal display panel integrates the touch electrode layer for realizing the touch function inside the liquid crystal display panel, to form the touch display panel with a Full In Cell Touch structure. The liquid crystal touch display panel with the Full In Cell Touch structure integrates the touch function and the display function, thereby realizing one-stop seamless production and the advantages of integration, lightness and thinness, low cost, low power consumption and high power consumption, and multi touch.

Figure 8:
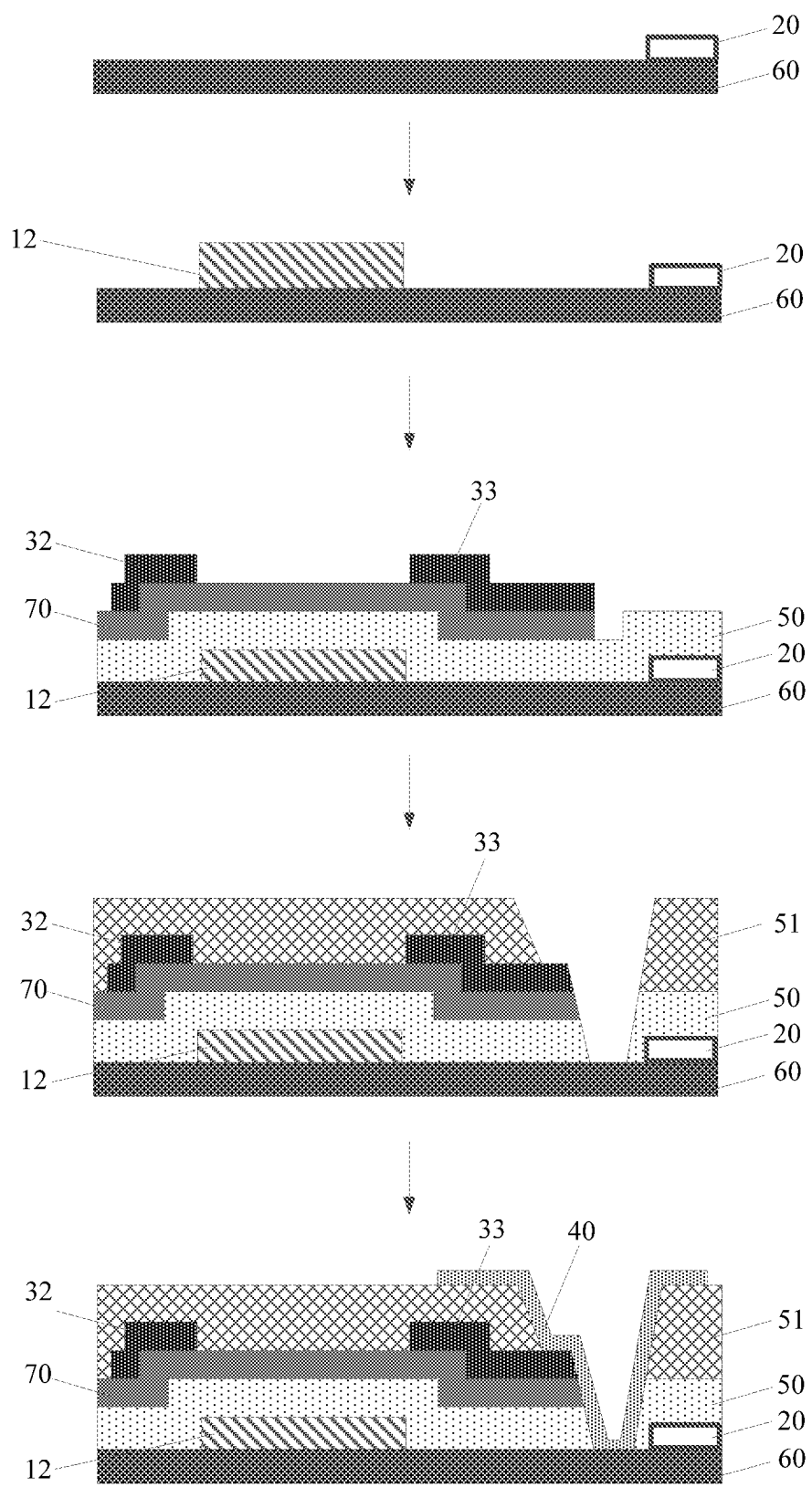
FIG. 8 is a schematic cross-sectional view along the direction B1-B2 in FIG. 2.

As shown in FIG. 8, when the array substrate includes the common electrode 20, a circuit structure in which the output electrode of the driving transistor in the sub-pixel driving circuit is directly coupled to the corresponding pixel electrode 40 is taken as an example, the manufacturing process of the array substrate is as follows. First, the common electrode 20 is formed on the substrate 60; then, the gate line 10 and the functional electrode 11 (including the first sub-functional electrode portion 110, the second sub-function electrode portion 110 and the second sub-function electrode portion 110) are formed on the side of the substrate 60 where the common electrode 20 is formed. An entire first insulating layer 50 are formed to cover the gate line 10, the functional electrode 11 and the gate electrode 12. An active layer 70, an input electrode 32 and an output electrode 33 are formed on the side of the first insulating layer 50 away from the substrate 60. The driving transistor includes the gate electrode 12 and a part of the first insulating layer 50, the active layer 70, the input electrode 32 and the output electrode 33; then a passivation layer 51 is formed on the side of the input electrode 32 and the output electrode 33 away from the substrate; a via hole is formed passing through the first insulating layer 50 and the passivation layer 51, the via hole can expose a part of the output electrode 33, and finally a pixel electrode 40 is formed on the side of the passivation layer 51 away from the substrate 60, a part of the pixel electrode 40 can be filled in the via hole and can be coupled to the output electrode 33, and the remaining part of the pixel electrode 40 is located outside the via hole.

It should be noted that both the common electrode 20 and the pixel electrode 40 can be made of indium tin oxide.

In some embodiments, the orthographic projection each of the functional electrodes 11 (including the first sub-functional electrode portion 110, the second sub-functional electrode portion 111, and the third sub-functional electrode portion 112) on the substrate 60 of the array substrate at least partially overlaps the orthographic projection of the corresponding non-opening area of the sub-pixel on the substrate 60.

In the array substrate provided by the above-mentioned embodiment, the orthographic projection of the functional electrode 11 with a light-shielding function on the substrate 60 of the array substrate at least partially overlaps the orthographic projection of the corresponding non-opening area of the sub-pixel on the substrate 60, so that in the direction perpendicular to the substrate 60, the functional electrode 11 can shield the non-opening area of the corresponding sub-pixel, when the array substrate and the opposite substrate are arranged oppositely to form a cell, the black matrix pattern on the opposite substrate only needs to shield an area in the non-opening area corresponding to each of the sub-pixels that is not shielded by the functional electrode 11, to avoid abnormal light leakage in the non-opening area, and ensure the display effect of the formed liquid crystal display panel. Therefore, when the array substrate and the opposite substrate provided in the above embodiment are arranged oppositely to form a liquid crystal display panel, the size of the black matrix to be provided in the opposite substrate be effectively reduced, the production cost of the opposite substrate may be reduced; moreover, the aperture ratio of the liquid crystal display panel is efficiently improved.

Figure 7:
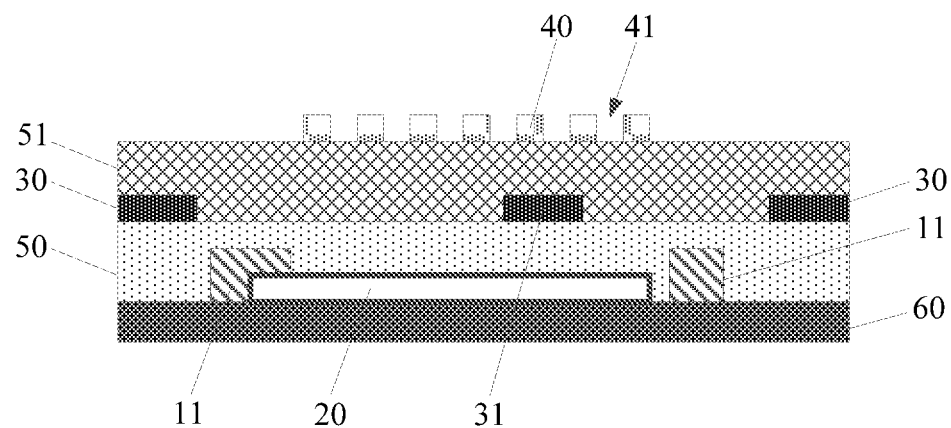
FIG. 7 is a schematic cross-sectional view along the direction A1-A2 in FIG. 2.

As shown in FIGS. 2 and 7, in some embodiments, the orthographic projection of the first sub-function electrode portion 110 on the substrate 60, the orthographic projection of the second sub-function electrode portion 111 on the substrate 60, the orthographic projections of the third sub-function electrode portion 112 on the substrate 60 are all located on the periphery of the orthographic projection of the pixel electrode 40 in the corresponding sub-pixel on the substrate 60.

Specifically, the above arrangement enables the first sub-function electrode portion 110, the second sub-function electrode portion 111, and the third sub-function electrode portion 112 to achieve light shielding of the non-opening area corresponding to the sub-pixel, and the opening area corresponding to the sub-pixel is not shielded, which is more conducive to improving the aperture ratio.

Referring to FIG. 2, in some embodiments, the plurality of sub-pixels includes a plurality of sub-pixel rows, and each of the sub-pixel rows includes a plurality of the sub-pixels arranged along the extending direction of the gate line 10.

The gate line 10 corresponds to the sub-pixel row in a one-to-one manner, and the gate line 10 is coupled to the sub-pixel driving circuit included in each sub-pixel in the corresponding sub-pixel row.

The orthographic projection of the first sub-function electrode portion 110 on the substrate 60, the orthographic projection of the second sub-function electrode portion 111 on the substrate 60, and the orthographic projection of the third sub-function electrode portion 112 on the substrate 60 and the orthographic projection of the corresponding gate line 10 on the substrate 60 enclose the opening area of the corresponding sub-pixel together.

Specifically, the plurality of sub-pixels may be arranged in an array, that is, it may be divided into a plurality of sub-pixel rows and a plurality of sub-pixel columns, wherein each sub-pixel row includes a plurality of sub-pixels arranged along the extending direction of the gate line 10, each sub-pixel column includes a plurality of the sub-pixels arranged along the extending direction of the data line 30. The gate lines 10 correspond to the sub-pixel rows in a one-to-one manner, and the gate line 10 is coupled to the sub-pixel driving circuit included in each sub-pixel in the corresponding sub-pixel row, so as to provide scanning signals to the sub-pixel driving circuit in each sub-pixel. The data lines 30 correspond to the sub-pixel columns in a one-to-one manner, and the data line 30 is coupled to the sub-pixel driving circuit included in each sub-pixel in the corresponding sub-pixel column, so as to provide a data signal to the sub-pixel driving circuit included in each sub-pixel.

The functional electrode 11 may have various specific structures. For example, an orthographic projection of the first sub-functional electrode portion 110 on the substrate 60, the orthographic projection of the second sub-functional electrode portion 111 on the substrate 60, the orthographic projection of the third sub-function electrode portion 112 on the substrate 60, and the orthographic projection of the corresponding gate line 10 on the substrate 60 enclose the opening area of the corresponding sub-pixel together; when the functional electrode 11 has this structure, the functional electrode 11 may shield a large area of the non-opening area corresponding to the sub-pixel, which is more conducive to reducing the size of the black matrix pattern on the opposite substrate.

Figure 4:
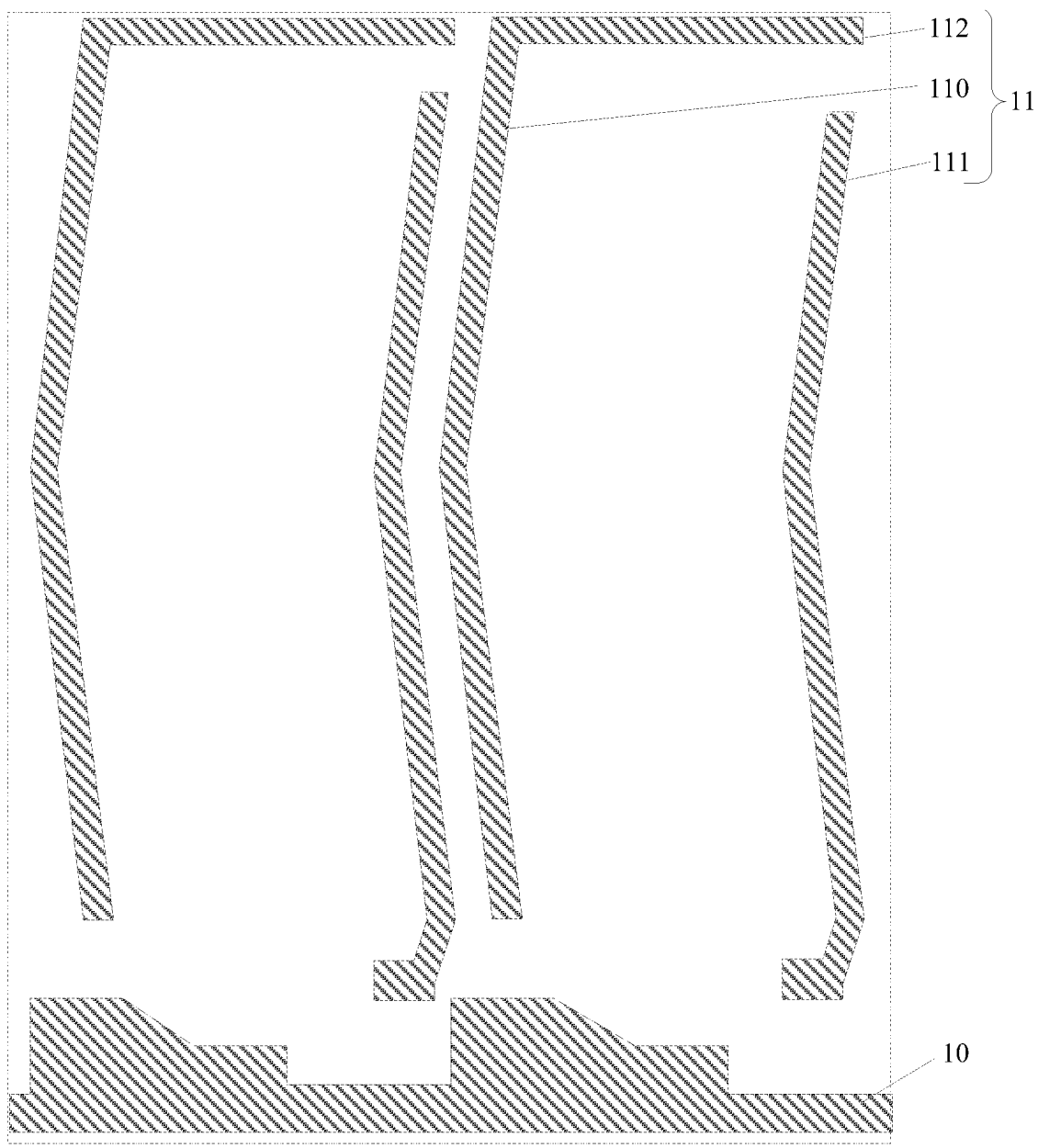
Figure 5:
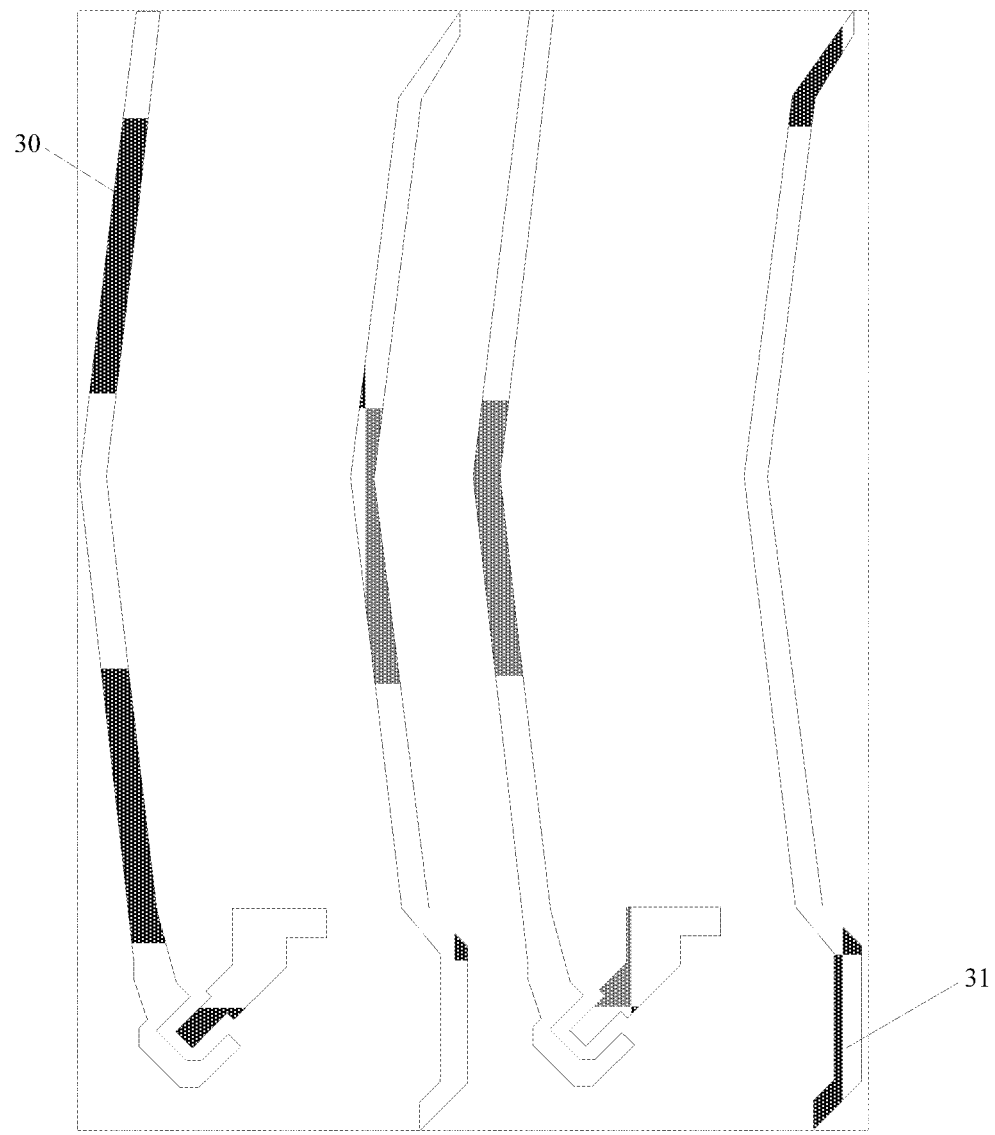
Figure 6:
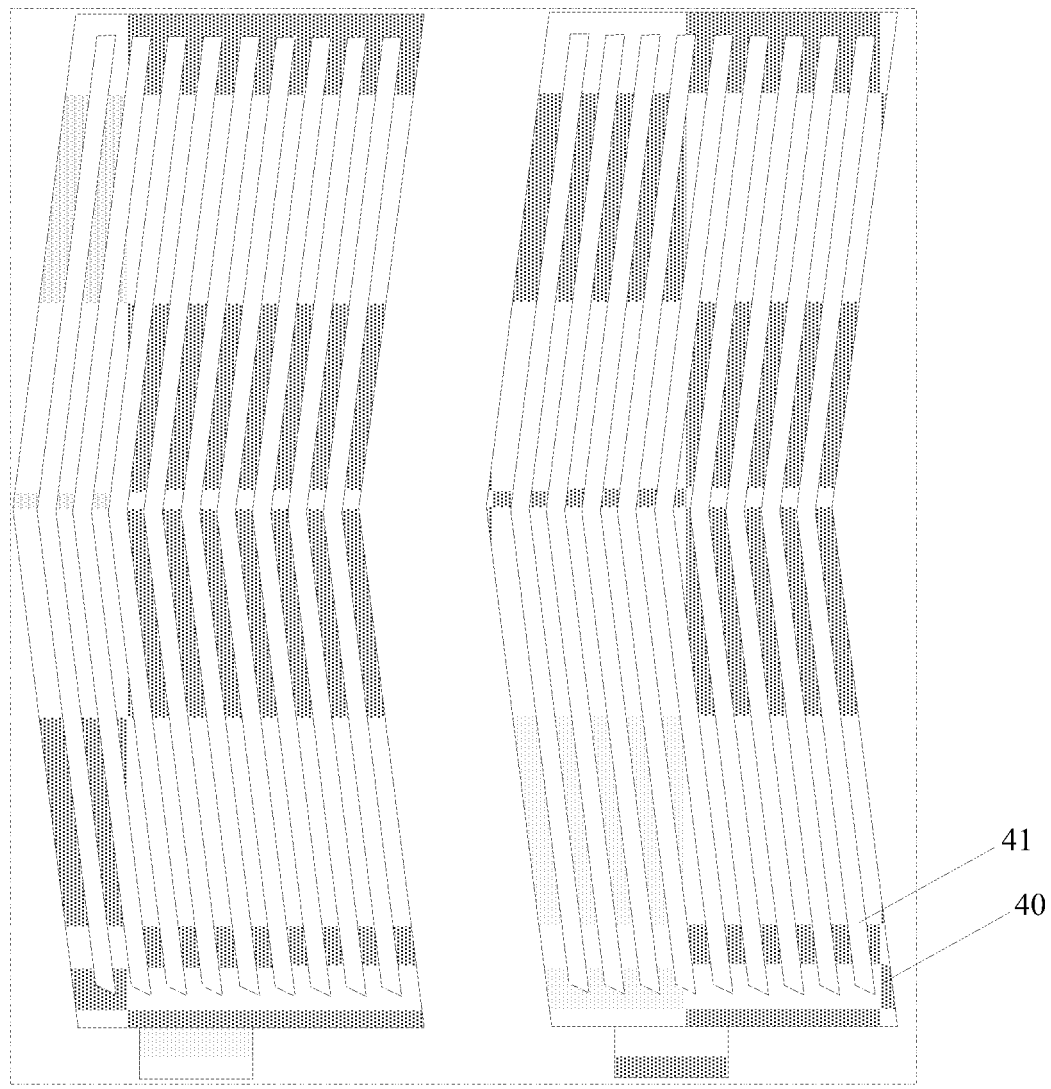

As shown in FIGS. 2 and 4, in some embodiments, the first sub-function electrode portion 110, the second sub-function electrode portion 111, and the third sub-function electrode portion 112 may be arranged in the same layer and made of the same material as the gate lines 10.

Specifically, since the gate lines 10 and the data lines 30 are located on different layers of the array substrate and are insulated from each other, the first sub-function electrode portion 110, the second sub-functional electrode portion 111 and the third sub-functional electrode portion 112 are all provided in the same layer as the gate line 10 to avoid short circuit between the functional electrode 11 and the data line 30. Moreover, the first sub-function electrode portion 110, the second sub-function electrode portion 111, and the third sub-function electrode portion 112 are all arranged in the same layer and made of the same material as the gate lines 10, which also enables the functional electrode 11 and the gate lines 10 to be formed in the same patterning process, thereby avoiding an additional process of making the functional electrode 11, which greatly simplifies the production process of the array substrate and reduces production costs.

In some embodiments, the orthographic projection of the first sub-function electrode portion 110 on the substrate 60 partially overlaps the orthographic projection of the data line 30 on a first side on the substrate 60; and/or, the orthographic projection of the second sub-function electrode portion 111 on the substrate 60 partially overlaps the orthographic projection of the data line 30 on a second side on the substrate 60.

Specifically, since the data lines 30 are located in the non-opening area, when the functional electrode 11 is used to shield the non-opening area, the orthographic projection of each of the data lines 30 on the substrate 60 partially overlaps the orthographic projection of an adjacent first sub-functional electrode portions 110 and/or second sub-functional electrode portions 111 on the substrate 60, so that the first sub-functional electrode portions 110 and/or the second sub-function electrode portion 111 can partially shield the data line 30, so that the size of the black matrix pattern on the opposite substrate can be further reduced.

In more detail, as shown in FIG. 2, when the first sub-function electrode portion 110 and the second sub-function electrode portion 111 are arranged on both sides of the data line 30 along a direction perpendicular to the extension direction of the data line 30, the orthographic projection of the data line 30 on the substrate 60 partially overlaps both the orthographic projection of the first sub-function electrode portion 110 and the orthographic projection of the second sub-function electrode portion 111 at both sides of the data line on the substrate 60; it is also possible to set that the orthographic projection of the data line 30 on the substrate 60 partially overlaps the orthographic projection of one of the first sub-function electrode portion 110 and the second sub-function electrode portion 111 at one side of the data line on the substrate 60.

It is worth noting that when the orthographic projection of the data line 30 on the substrate 60 partially overlaps both the orthographic projection of the first sub-function electrode portion 110 and the orthographic projection of the second sub-function electrode portion 111 at both sides of the data line on the substrate 60, the first sub-function electrode portion 110 and the second sub-function electrode portion 111 arranged on the two sides of the data line may be connected to each other or insulated from each other according to actual needs.

As shown in FIG. 2 and FIG. 7, in some embodiments, the orthographic projection of the first sub-functional electrode portion 110 on the substrate 60 is located between the orthographic projection of the opening area of the sub-pixel on the substrate 60 and the orthographic projection of the data line 30 at the first side on the substrate 60; and/or the orthographic projection of the second sub-function electrode portion 111 on the substrate 60 is arranged between the orthographic projection of the opening area of the sub-pixel on the substrate 60 and the orthographic projection of the data line 30 at the second side on the substrate 60.

Specifically, under the above arrangement, the orthographic projection of each data line 30 on the substrate 60 do not overlap orthographic projections of all the functional electrodes 11 (the first sub-functional electrode portion 110, the second sub-functional electrode portion 111, and the third sub-function electrode portion 112) on the substrate 60, and along the extension direction perpendicular to the data line 30, there is a preset distance between the first sub-function electrode portion 110 and the second sub-function electrode portion 111 arranged at the two sides of the data lines, and the preset distance is greater than or equal to the width of the data line 20 in a direction perpendicular to the extension direction of the data line 30.

It is worth noting that when the orthographic projection of each data line 30 on the substrate 60 does not overlap the orthographic projection of all the functional electrodes 11 on the substrate 60, after the array substrate and the opposite substrate are arranged oppositely to form a cell, the data line 30 can be shielded by the black matrix pattern on the opposite substrate.

In the array substrate provided by the foregoing embodiment, the orthographic projection of each of the data lines 30 on the substrate 60 does not overlap the orthographic projections of all the functional electrodes 11 on the substrate 60. It is beneficial to the data line 30 to transmit data signals stably, thereby better ensuring that the array substrate has stable working performance.

The embodiments of the present disclosure also provide a display device, including the array substrate provided in the above-mentioned embodiments.

Since in the array substrate provided by the foregoing embodiment, the orthographic projection of the touch signal line 31 on the substrate 60 overlaps the orthographic projection of the opening area of each sub-pixel in the corresponding target sub-pixel column on the substrate 60, and the extension direction of the slit 41 in each pixel electrode 40 is the same as the extension direction of the data line 30, which effectively reduces the area of the non-opening area around each sub-pixel, and during the aligning process of the alignment film on the array substrate, a large rubbing shadow area will not be formed near the data line 30. Therefore, when the array substrate provided by the above-mentioned embodiment and the opposite substrate are arranged oppositely to form a cell, the width of the black matrix pattern used to shield the data line 30 on the opposite substrate in the direction perpendicular to the extension direction of the data line 30 can be reduced, thereby effectively increasing the aperture ratio of the display device.

In addition, because the array substrate provided by the above-mentioned embodiments also has the advantages of simple manufacturing process, low production cost, and ability to integrate touch electrode layers, the display device including the array substrate also has all the advantages of the above-mentioned array substrate. All the advantages of the array substrate described above will not be repeated herein.

In some embodiments, the orthographic projection of the first sub-functional electrode portion 110 of the functional electrode 11 of the array substrate on the substrate 60 partially overlaps the orthographic projection of the data line 30 at the first side on the substrate 60; the orthographic projection of the second sub-functional electrode portion 111 of the functional electrode 11 of the array substrate on the substrate 60 partially overlaps the orthographic projection of the data line 30 on the second side on the substrate 60.

The display device further includes an opposite substrate arranged opposite to the array substrate, and a black matrix pattern corresponding to the data line 30 in a one-to-one manner is disposed on the opposite substrate. The orthographic projection of the black matrix pattern on the substrate 60 coincides with the orthographic projection of a first part of the corresponding data line 30 on the substrate 60. The orthographic projection of the first part of the data line 30 on the substrate 60 does not overlap the orthographic projection of a sub-function electrode portion 110 on the substrate, and does not overlap the orthographic projection of the second sub-function electrode portion 111 on the substrate.

Specifically, when the orthographic projection of each data line 30 on the substrate 60 partially overlaps the orthographic projection of the first sub-functional electrode portion 110 and the second sub-functional electrode portion 111 on the substrate, the orthographic projection of the first portion of the data line 30 on the substrate 60 does not overlap the orthographic projections of the first sub-function electrode portion 110 on the substrate 60 and the orthographic projections of the second sub-function electrode portion 111 on the substrate 60, and the orthographic projections of the second part of the data line 30 other than the first part on the substrate 60 are covered by the orthographic projection of the first sub-function electrode portion 110 and the second sub-function electrode portion 111 on the substrate 60. Therefore, when the display device further includes an opposite substrate arranged opposite to the array substrate, the black matrix pattern on the opposite substrate may be sued to shield the first part of the data line 30, that is, the orthographic projection of the black matrix pattern on the substrate 60 of the array substrate coincide with the orthographic projection of the first part of the data line 30 on the substrate 60, thereby avoiding light leakage at the data line 30, and improving the display quality of the display device.

In some embodiments, the orthographic projection of the first sub-functional electrode portion of the functional electrode in the array substrate on the substrate is located between the orthographic projection of the opening area of the sub-pixel in the array substrate on the substrate and the orthographic projection of the data line 30 at the first side on the substrate, the orthographic projection of the second sub-functional electrode portion of the functional electrode in the array substrate on the substrate is located between the orthographic projection of the opening area of the sub-pixel on the substrate and the orthographic projection of the data line at the second side on the substrate.

The display device further includes: an opposite substrate arranged opposite to the array substrate, the opposite substrate is provided with black matrix patterns corresponding to the data lines in a one-to-one manner, and the orthographic projection of the black matrix patterns on the substrate covers the orthographic projection of the corresponding data line on the substrate.

The orthographic projection of the black matrix pattern on the substrate partially overlaps the orthographic projection of the first sub-function electrode portion adjacent to the corresponding data line on the substrate; and/or, the orthographic projection of the black matrix pattern on the substrate partially overlaps the orthographic projection of the second sub-function electrode portion adjacent to the corresponding data line on the substrate.

Specifically, in the array substrate provided by the above-mentioned embodiment, the orthographic projection of each of the data lines 30 on the substrate 60 doe not overlap the orthographic projections of all the first sub-function electrode portions 110 and the second sub-function electrode portions 111 on the substrate 60, along the a direction perpendicular to the extension direction of the data line 30, there is a preset distance between the first sub-function electrode portion 110 and the second sub-function electrode portion 111 located on both sides of the data line 30. The preset distance is greater than or equal to the width of the data line 30 in the direction perpendicular to the extending direction of the data line.

When the display device further includes an opposite substrate arranged opposite to the array substrate, the orthographic projection of the black matrix pattern in the opposite substrate on the substrate 60 overlaps the orthographic projection of the corresponding data line 30 on the substrate, and the orthographic projection of the black matrix pattern in the opposite substrate on the substrate 60 partially overlaps each of the orthographic projections of the first sub-function electrode portion 110 and the second sub-function electrode portion 111 adjacent to the data line 30 corresponding to the black matrix, so that the black matrix pattern may shield the data line 30, a gap located between the data line 30 and the first sub-function electrode portions 110 and a gap between the data line 30 and the second sub-function electrode portion 111, thereby avoiding light leakage at the data line 30, and improving the display quality of the display device.

In the display device with the above structure, an orthographic projection of each of the data lines 30 on the substrate 60 does not overlap the orthographic projections of all the first sub-function electrode portions 110 and the second sub-function electrode portions 111 on the substrate 60, which is more conducive for the data line 30 to transmit data signals stably, thereby better ensuring that the display device has stable working performance.

It is worth noting that the opposite substrate may be provided with a color resist unit in addition to the black matrix pattern; of course, the color resist unit may also be provided on the array substrate according to actual needs.

It should be noted that the display device may be any product or component with a display function, such as a TV, a monitor, a digital photo frame, a mobile phone, a tablet computer, and the like.

Unless otherwise defined, the technical terms or scientific terms used in the present disclosure shall have the usual meanings understood by those skilled in the art. The "first", "second" and similar words used in the present disclosure do not indicate any order, quantity, or importance, but are only used to distinguish different components. "Include" or "comprise" and other similar words mean that the element or item appearing before the word encompasses the element or item listed after the word and its equivalents, but does not exclude other elements or items. Similar words such as "connected", "coupled" are not limited to physical or mechanical connections, but may include electrical connections, whether direct or indirect. "Up", "Down", "Left", "Right" and so on are only used to indicate the relative position relationship. When the absolute position of the described object changes, the relative position relationship may also change accordingly.

It will be understood that when an element such as a layer, film, area or substrate is referred to as being "above" or "under" another element, the element can be "directly" above or under the other element. Or there may be intermediate elements.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. An array substrate, comprising:
a substrate;
two data lines adjacent to each other arranged on the substrate;
a gate line, arranged on the substrate and crossing the two data lines;
a sub-pixel arranged in an area enclosed by the gate line and the two data lines;

a touch signal line, arranged on the substrate and extending in a same direction as an extension direction of the two data lines, wherein orthographic projection of the touch signal line on the substrate partially overlaps orthographic projection of an opening area of the sub-pixel on the substrate;

a functional electrode arranged on the substrate, wherein the functional electrode includes a first sub-functional electrode portion and a second sub-functional electrode portion, an extension direction of the first sub-functional electrode portion, and an extension direction of the second sub-functional electrode portion is the same as the extension direction of the two data lines, the first sub-functional electrode portion is located on a first side of the opening area of the sub-pixel, and the second sub-functional electrode portion is located on a second side of the opening area of the sub-pixel, and the first side and the second side are opposite to each other along a direction perpendicular to the extension direction the two data lines; along an extension direction of the gate line and on a same straight line, a distance between orthographic projection of the first sub-function electrode portion on the substrate and orthographic projection of the touch signal line on the substrate is smaller than a distance between orthographic projection of the data line on the first side on the substrate and orthographic projection of the touch signal line on the substrate; along the extension direction of the gate line and on a same straight line, a distance between the orthographic projection of the second sub-function electrode portions on the substrate and the orthographic projection of the touch signal line on the substrate is smaller than a distance between orthographic projection of the data line on the second side on the substrate and the orthographic projection of the touch signal line on the substrate; and a touch electrode unit arranged on the substrate and coupled to the touch signal line.

2. The array substrate according to claim 1, wherein, along the extension direction of the gate line and on a same straight line, the distance between the orthographic projection of the first sub-function electrode portion on the substrate and the orthographic projection of the touch signal line on the substrate is greater than the distance between the orthographic projection of the second sub-function electrode portion on the substrate and the orthographic projection of the touch signal line on the substrate.

3. The array substrate according to claim 1, wherein the array substrate comprises: a plurality of gate lines, a plurality of data lines, and a plurality of sub-pixels;

the plurality of gate lines and the plurality of data lines enclose a plurality of sub-pixel areas, and the plurality of sub-pixels are located in the plurality of sub-pixel areas in a one-to-one correspondence;

the plurality of sub-pixels include a plurality of sub-pixel columns, and the sub-pixel column includes a plurality of the sub-pixels arranged along an extension direction of the data line;

the array substrate further comprises:
a touch electrode layer arranged in a touch area of the array substrate, the touch area includes a plurality of touch sub-areas, the touch electrode layer includes a plurality of the touch electrode units, the plurality of touch electrode units are located in the plurality of touch sub-areas in a one-to-one correspondence; and, a plurality of touch signal lines coupled to the plurality of touch electrode units in a one-to-one correspondence, and the plurality of touch signal lines correspond to target sub-pixel columns of the plurality of sub-pixel columns in a one-to-one correspondence, the orthographic projection of the touch signal line on the substrate partially overlaps orthographic projection of an opening area of each sub-pixel in the corresponding target sub-pixel column on the substrate;

the array substrate further includes: a plurality of the functional electrodes corresponding to the plurality of sub-pixels in a one-to-one correspondence, orthographic projection of the touch signal line on the substrate, and orthographic projection of the second sub-function electrode portion corresponding to each target sub-pixel in a corresponding target sub-pixel column on the substrate have a first overlapping area, and the touch signal line is coupled to the second sub-function electrode portion corresponding to at least a part of the target sub-pixels through a first via hole in at least a part of first overlapping area; target sub-pixels included in the target sub-pixel column corresponding to the touch signal line is located in a touch sub-area corresponding to the touch signal line.

4. The array substrate according to claim 3, wherein the functional electrode further comprises a third sub-functional electrode portion, an extension direction of the third sub-functional electrode portion is the same as the extension direction of the gate line, and the third sub-function electrode portion is electrically connected to the first sub-function electrode portion.

5. The array substrate according to claim 4, wherein each sub-pixel further comprises a common electrode; the common electrode is located between a corresponding functional electrode and the substrate, and is in direct contact with the first sub-function electrode portion and the third sub-function electrode portion of the corresponding functional electrode.

6. The array substrate according to claim 5, wherein the orthographic projection of the touch signal line on the substrate and the orthographic projection of the second sub-function electrode portion corresponding to each sub-pixel in the target sub-pixel column on the substrate have a first overlapping area, and the touch signal line is coupled to the second sub-function electrode portion corresponding to each sub-pixel in the sub-pixel column through the first via hole in the first overlapping area.

7. The array substrate according to claim 6, wherein
the array substrate further includes: a first conductive connection portion and a second conductive connection portion;

in the functional electrode corresponding to each target sub-pixel, the third sub-functional electrode portion is coupled to the second sub-functional electrode portion through the first conductive connection portion;

in the functional electrodes corresponding to each sub-pixel located in the same touch sub-area, along the extending direction of the gate line, adjacent third sub-functional electrode portions are coupled to each other through the second conductive connecting portion;

common electrodes located in the same touch sub-area are multiplexed as touch electrode units in the touch sub-area.

8. The array substrate according to claim 7, wherein the first conductive connection portion and the second conductive connection portion are arranged in the same layer and made of the same material as the functional electrode.

9. The array substrate according to claim 7, wherein the array substrate further comprises a plurality of compensation signal lines, and the plurality of compensation signal lines correspond to non-target sub-pixel columns in the plurality of sub-pixel columns in a one-to-one correspondence, orthographic projection of the compensation signal line on the substrate overlaps orthographic projection of the opening area of each sub-pixel in the corresponding non-target sub-pixel column on the substrate;
the orthographic projection of the compensation signal line on the substrate, the orthographic projection of the second sub-functional electrode portion corresponding to each sub-pixel in the corresponding non-target sub-pixel column on the substrate have a second overlapping area, the compensation signal line is coupled to the second sub-function electrode portion corresponding to each sub-pixel in the corresponding non-target sub-pixel column through a second via hole in the second overlapping area.

10. The array substrate according to claim 5, wherein the third sub-function electrode portion is electrically connected to the second sub-function electrode portion;
the array substrate further includes: a third conductive connection portion couple to the two third sub-functions electrode portions that are adjacent along the extension direction of the gate line and located in the same touch sub-area;
common electrodes located in the same touch sub-area are multiplexed as touch electrode units in the touch sub-area.

11. The array substrate according to claim 10, wherein the array substrate further comprises:
a plurality of compensation patterns, the plurality of compensation patterns correspond to non-target sub-pixel columns included in a plurality of the touch sub-areas in a one-to-one correspondence, and each compensation pattern is coupled to the second sub-function electrode portion corresponding to each non-target sub-pixel in the corresponding non-target sub-pixel column;
orthographic projection of each compensation pattern on the substrate partially overlaps orthographic projection of the opening area of the corresponding non-target sub-pixel on the substrate; each compensation pattern and the touch signal line are arranged in the same layer and made of the same material, and have the same extension direction as the touch signal line.

12. The array substrate according to claim 1, wherein the touch signal line and the data line are arranged in the same layer and made of the same material.

13. The array substrate according to claim 4, wherein each sub-pixel includes a pixel electrode located on the substrate; the pixel electrode has a plurality of slits, and the extending direction of the plurality of slits is the same as the extension direction of the data line.

14. The array substrate according to claim 13, wherein the orthographic projection of the touch signal line on the substrate covers orthographic projection of at least one slit included in each pixel electrode in the corresponding target sub-pixel column on the substrate; or
wherein the touch signal line has a width of 4 μm-8 μm in a direction perpendicular to the extension direction of the touch signal line; or
wherein the slit has a width of 2 μm-4 μm in a direction perpendicular to the extension direction of the slit; or the orthographic projection of the touch signal line on the substrate, the orthographic projection of the opening area of each sub-pixel in the corresponding target sub-pixel column on the substrate have a third overlapping area, and the ratio of an area of the third overlapping area to an area of the opening area of the sub-pixel is 4%-8%; or
wherein the touch electrode layer and the pixel electrode are stacked and the touch electrode layer is located between the substrate and the pixel electrode; or
wherein the orthographic projection of the first sub-functional electrode portion on the substrate, the orthographic projection of the second sub-functional electrode portion on the substrate, and the orthographic projection of the third sub-function electrode portion on the substrate are all located on the periphery of the orthographic projection of the pixel electrode in the corresponding sub-pixel on the substrate.

15. The array substrate according to claim 4, wherein the plurality of sub-pixels includes a plurality of sub-pixel rows, and each sub-pixel row includes a plurality of the sub-pixels arranged along the extending direction of the gate lines;
the gate lines correspond to the sub-pixel rows in a one-to-one correspondence, and the gate line and the sub-pixel driving circuit included in each sub-pixel in the corresponding sub-pixel row are coupled;
the orthographic projection of the first sub-function electrode portion on the substrate, the orthographic projection of the second sub-function electrode portion on the substrate, the orthographic projection of the third sub-function electrode portion on the substrate, and the orthographic projection of the corresponding gate line on the substrate enclose the opening area of the corresponding sub-pixel together.

16. The array substrate according to claim 15, wherein the first sub-function electrode portion, the second sub-function electrode portion, and the third sub-function electrode portion are in the same layer and made of a same material as the gate line.

17. The array substrate according to claim 1, wherein the orthographic projection of the first sub-function electrode portion on the substrate partially overlaps the orthographic projection of the data line on the first side on the substrate; and/or,
the orthographic projection of the second sub-function electrode portion on the substrate partially overlaps the orthographic projection of the data line on the second side on the substrate.

18. The array substrate according to claim 1, wherein the orthographic projection of the first sub-functional electrode portion on the substrate is located between the orthographic projection of the opening area of the sub-pixel on the substrate and the orthographic projection of the data line on the first side on the substrate; and/or,
the orthographic projection of the second sub-function electrode portion on the substrate is located between the orthographic projection of the opening area of the sub-pixel on the substrate and the orthographic projection of the data line on the second side on the substrate.

19. A display device comprising the array substrate according to claim 1.

20. The display device according to claim 19, wherein the orthographic projection of the first sub-functional electrode portion of the functional electrode in the array substrate on the substrate partially overlaps the orthographic projection the data line on the first side on the substrate, the orthographic projection of the second sub-function electrode portion of the functional electrode in the array substrate on the substrate partially overlaps the orthographic projection of the data line on the second side on the substrate;

the display device further includes:
an opposite substrate arranged opposite to the array substrate, the opposite substrate is provided with black matrix patterns corresponding to the data lines in a one-to-one correspondence, and the orthographic projection of the black matrix pattern on the substrate coincides with the orthographic projection of a first part of the corresponding data line on the substrate, the orthographic projection of the first part of the corresponding data line on the substrate does not overlap the orthographic projection of the first sub-function electrode portion on the substrate, and does not overlaps the orthographic projection of the second sub-function electrode portion on the substrate; or wherein the orthographic projection of the first sub-functional electrode portion of the functional electrode in the array substrate on the substrate is located between the orthographic projection of the opening area of the sub-pixel in the array substrate on the substrate and orthographic projection of the data line on the first side on the substrate; the orthographic projection of the second sub-functional electrode portion of the functional electrode in the array substrate on the substrate is located between the orthographic projection of the opening area of the sub-pixel on the substrate and the orthographic projection of the data line on the second side on the substrate;

the display device further includes:
an opposite substrate arranged opposite to the array substrate, the opposite substrate is provided with black matrix patterns corresponding to the data lines in a one-to-one correspondence, and the orthographic projection of the black matrix patterns on the substrate covers the orthographic projection of the corresponding data line on the substrate; the orthographic projection of the black matrix pattern on the substrate partially overlaps the orthographic projection of the first sub-function electrode portion adjacent to the corresponding data line on the substrate; and/or, the orthographic projection of the black matrix pattern on the substrate partially overlaps the orthographic projection of the second sub-function electrode portion adjacent to the corresponding data line on the substrate.

* * * * *